(12) United States Patent
Tierney et al.

(10) Patent No.: US 9,017,577 B2
(45) Date of Patent: Apr. 28, 2015

(54) INDACENODITHIOPHENE AND INDACENODISELENOPHENE POLYMERS AND THEIR USE AS ORGANIC SEMICONDUCTORS

(75) Inventors: Steven Tierney, Southampton (GB); Clare Bailey, Southampton (GB); William Mitchell, Chandler's Ford (GB); Weimin Zhang, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 1106 days.

(21) Appl. No.: 13/059,480

(22) PCT Filed: Jul. 24, 2009

(86) PCT No.: PCT/EP2009/005374
§ 371 (c)(1),
(2), (4) Date: May 27, 2011

(87) PCT Pub. No.: WO2010/020329
PCT Pub. Date: Feb. 25, 2010

(65) Prior Publication Data
US 2011/0226999 A1 Sep. 22, 2011

(30) Foreign Application Priority Data
Aug. 18, 2008 (EP) .................................... 08014658

(51) Int. Cl.
| | | |
|---|---|---|
| *H01B 1/00* | (2006.01) | |
| *C09K 11/02* | (2006.01) | |
| *C08F 30/06* | (2006.01) | |
| *C08G 79/08* | (2006.01) | |
| *C07D 411/00* | (2006.01) | |
| *H01L 51/00* | (2006.01) | |
| *C08G 61/12* | (2006.01) | |
| *H01B 1/12* | (2006.01) | |
| *H01L 51/05* | (2006.01) | |

(52) U.S. Cl.
CPC ............ *H01L 51/0036* (2013.01); *C08G 61/12* (2013.01); *C08G 61/123* (2013.01); *C08G 61/126* (2013.01); *C08G 2261/124* (2013.01); *C08G 2261/141* (2013.01); *C08G 2261/3162* (2013.01); *C08G 2261/3223* (2013.01); *C08G 2261/3243* (2013.01); *C08G 2261/3244* (2013.01); *C08G 2261/3246* (2013.01); *H01B 1/127* (2013.01); *H01B 1/128* (2013.01); *H01L 51/0512* (2013.01); *Y02E 10/549* (2013.01)

(58) Field of Classification Search
None
See application file for complete search history.

(56) References Cited

U.S. PATENT DOCUMENTS

| 7,754,841 | B2 | 7/2010 | O'Dell et al. | |
|---|---|---|---|---|
| 8,236,967 | B2 * | 8/2012 | Chen et al. | 549/41 |
| 2006/0149016 | A1 | 7/2006 | O'Dell et al. | |
| 2009/0171048 | A1 * | 7/2009 | Chan et al. | 526/256 |
| 2009/0299029 | A1 * | 12/2009 | Chan et al. | 528/370 |
| 2010/0168444 | A1 * | 7/2010 | Chen et al. | 549/41 |
| 2010/0171102 | A1 | 7/2010 | Ie et al. | |

FOREIGN PATENT DOCUMENTS

| EP | 1491568 A1 | 12/2004 |
|---|---|---|
| EP | 2 075 274 A | 7/2009 |
| JP | 2008530254 A | 8/2008 |
| JP | 2008255097 A | 10/2008 |
| JP | 2009155648 A | 7/2009 |
| WO | 2004113412 A2 | 12/2004 |

OTHER PUBLICATIONS

International Search Report of PCT/EP2009/005374, Date of Completion Oct. 16, 2009, Date of Mailing Nov. 5, 2009, Examiner Rafaël Kiebooms.

Shu-Hua Chan, Chih-Ping Chen, Teng-Chih Chao, Ching Ting, Chin-Sheng Lin and Boa-Tsan Ko: "Synthesis, Characterization, and Photovoltaic Properties of Novel Semiconducting Polymers with Thiophene? Phenylene? Thiophene (TPT) as Coplanar Units," Macromolecules, vol. 41, Jul. 8, 2008,pp. 5519-5526, XP002550804.

Chunchang Zhao, Xiaohong Chen, Hyong Zhang, Man-Kit Ng: "4,9-Dihydro-s-indaceno[1,2-b:5,6-b] dithio phene-4,9-dione functionalized copolymers for organic photovoltaic devices", Journal of Polymer Science Part A: Polymer Chemistry, vol. 49, Apr. 15, 2008, pp. 2680-2688 XP002550805.

T.W. Bunnagel, B.S. Nehls, F. Galbrecht, K. Schottler, C.J. Kulda, M. Volk, J. Pina, J.S. Seixas De Melo, H.D. Burrows, U. Scherf: "Thiophene-phenylene/naohthalene-based step-ladder copolymers," Journal of Polymer Science Part A: Polymer Chemistry, vol. 46, Nov. 15, 2008, pp. 7342-7353, XP002550806.

Chao-Ying Yu, Chih-Ping Chen, Shu-Hua Chan, Gue-Wuu Hwang and Ching Ting: "Thiopelene/Phenylene/Thiophene-Based Low-Bandgap Conjugated Polymers for Efficient Near-Infrared Photovoltaic Applications," Chemistry of Materials, vol. 21, 29 Jun. 29, 2009, pp. 3262-3269, XP002550807.

Chih-Ping Chen, Shu-Hua Chan, Teng-Chih Chao, Ching Ting and Bao-Tsan Ko: "Low-Bandgap Poly (Thiophene-Phenylene-Thiophene) Derivatives with Broaden Absorption Spectra for Use in High-Performance Bulk-Heterojunction Polymer Solar Cells," Journal of the American Chemical Society, vol. 130, Aug. 29, 2009, pp. 12828-12833, XP002550809.

English Translation (uncertified) of the Notice of Reason(s) for Rejection in corresponding Japanese Patent Application No. 2011-523322, dated Aug. 13, 2013.

* cited by examiner

*Primary Examiner* — Harold Pyon
*Assistant Examiner* — Jaison Thomas
(74) *Attorney, Agent, or Firm* — Millen, White, Zelano & Branigan, P.C.

(57) ABSTRACT

The invention relates to conjugated polymers comprising indacenodithiophene or indacenoselenophene units or derivatives thereof, to methods of their preparation, to novel monomer units used therein, to the use of the polymers in organic electronic (OE) devices, and to OE devices comprising the polymers.

11 Claims, No Drawings

INDACENODITHIOPHENE AND INDACENODISELENOPHENE POLYMERS AND THEIR USE AS ORGANIC SEMICONDUCTORS

FIELD OF THE INVENTION

The invention relates to conjugated polymers comprising indacenodithiophene or indacenoselenophene units or derivatives thereof, to methods of their preparation, to novel monomer units used therein, to the use of the polymers in organic electronic (OE) devices, and to OE devices comprising the polymers.

BACKGROUND AND PRIOR ART

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), photodetectors, organic photovoltaic (OPV) cells, sensors, memory elements and logic circuits to name just a few. The organic semiconducting materials are typically present in the electronic device in the form of a thin layer, for example less than 1 micron thick.

The performance of OFET devices is principally based upon the charge carrier mobility of the semiconducting material and the current on/off ratio, so the ideal semiconductor should have a low conductivity in the off state, combined with a high charge carrier mobility ($>1 \times 10^{-3}$ cm$^2$ V$^{-1}$ s$^{-1}$). In addition, it is important that the semiconducting material is relatively stable to oxidation i.e. it has a high ionisation potential, as oxidation leads to reduced device performance. Further requirements for the semiconducting material are a good processability, especially for large-scale production of thin layers and desired patterns, and high stability, film uniformity and integrity of the organic semiconductor layer.

In prior art various materials have been proposed for use as OSCs in OFETs, including small molecules like for example pentacene, and polymers like for example polyhexylthiophene. However, the materials and devices investigated so far do still have several drawbacks, and their properties, especially the processability, charge-carrier mobility, on/off ratio and stability do still leave room for further improvement.

A promising class of conjugated polymers has been based upon the indenofluorene unit. First reported by Müllen and co-workers [S. Setayesh, D. Marsitzky, and K. Müllen, *Macromolecules*, 2000, 33, 2016], the homopolymer of indenofluorene was a candidate material for blue light emission in electroluminescent applications. Indenofluorene co-polymers have also been suggested for application as an OSC in transistor devices [WO 2007/131582 A1].

However, the performance of the OSC materials disclosed in prior art is still not always satisfying the current requirements on these materials, and leaves room for further improvement.

In particular, there is still a need for OSC materials that show high charge carrier mobility. Moreover, for use in OFETs there is a need for OSC materials that allow improved charge injection into the polymer semiconducting layer from the source-drain electrodes. For use in OPV cells, there is a need for OSC materials having a low bandgap, which enable improved light harvesting by the photoactive layer and can lead to higher cell efficiencies.

One aim of the present invention is to provide new OSC materials for use in electronic devices, which have the desired properties described above, and do in particular show good processability, high charge-carrier mobility, high on/off ratio, high oxidative stability and long lifetime in electronic devices. Another aim is to extend the pool of OSC materials available to the expert. Other aims of the present invention are immediately evident to the expert from the following detailed description.

The inventors of the present invention have found that these aims can be achieved by providing materials as described hereinafter. These materials are based on polymers comprising one or more s-indacenodithiophene or s-indacenodiselenophene units or derivatives thereof, as represented by the following formulae

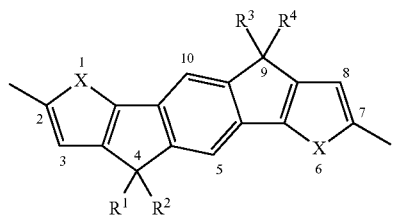

s-indaceno[1,2-b:5,6-b']dithiophene/selenophene

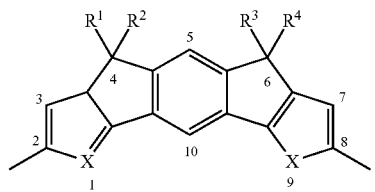

s-indaceno[1,2-b:7,6-b']dithiophene/selenophene
(wherein X is S or Se and R$^{1-4}$ denote for example hydrocarbyl groups), It has been found that these polymers are suitable for use as OSC materials in electronic devices, especially in OFETs and OPV cells, and as charge transport layer or interlayer material in polymer light emitting diodes (PLEDs), as they have good processability and at the same time show a high charge carrier mobility and high oxidative stability.

It was also found that the replacement of the terminal phenyl rings in indenofluorene with thiophene rings increases the electron-rich nature of the conjugated core and therefore increases the HOMO energy level of the resulting homopolymer, poly(2,7-s-indaceno[1,2-b:5,6-b']dithiophene). In poly(2,8-indenofluorene) the HOMO energy level is low-lying ($E_{HOMO}$=−5.49 eV as measured by cyclic voltammetry). This increase in the HOMO energy lower allows improved charge injection into the polymer semiconducting layer from the source-drain electrodes (typically made from gold, which has a workfunction of ~5.1 eV) when applied in a field-effect transistor.

In addition, this additional electron-richness can be exploited to prepare novel low bandgap polymers for photovoltaic applications. By combining the electron-rich s-indaceno[1,2-b:5,6-b']dithiophene unit and an electron-deficient unit (e.g. benzothiadiazole), resulting co-polymers have a low bandgap ($E_g$<2 eV). Low bandgap semiconducting polymers are advantageous in bulk heterojunction photovoltaic cells as they enable improved light harvesting by the photoactive layer, which can potentially lead to higher cell efficiencies.

In prior art there is a report of s-indaceno[1,2-b:5,6-b']dithiophene, but only as a small molecule material [K-T. Wong, T-C. Chao, L-C. Chi, Y-Y. Chu, A. Balaiah, S-F. Chiu, Y-H. Liu, and Y. Wang, *Org. Lett.*, 2006, 8, 5033]. There is also a report of a homopolymer of s-indaceno[1,2-b:5,6-b'] dithiophene [X. M. Hong, and D. M. Collard, *Polymer Preprints*, 2000, 41 (1), 189], however, this is polymerised at the bridging 4,9-positions and not at the terminal 2,7-positions as described hereinafter.

Furthermore, there is a report of 4,9-dihydro-s-indaceno[1,2-b:5,6-b']dithiophene-4,9-dione copolymers [C. Zhao, X. Chen, Y. Zhang, and M-K, Ng, *J. Polym. Sci., Part A: Polym. Chem.*, 2008, 46, 2680.] for application in bulk heterojunction photovoltaics. However, the copolymers reported therein comprise electron-rich thiophene-based co-monomers, instead of the electron-deficient co-monomers that should yield a lower bandgap polymer as desired in this invention.

In addition, there is a report of 4,4,9,9-tetraaryl-s-indaceno [1,2-b:5,6-b']dithiophene homopolymer and copolymers [S-H, Chan, C-P. Chen, T-C. Chao, C. Ting, C-S. Lin, and B-T Ko, *Macromolecules*, 2008, published online], again for application in bulk heterojunction photovoltaics. However, the copolymers reported also comprise electron-rich thiophene-based co-monomers, instead of electron-deficient comonomers that should yield a lower bandgap polymer. Furthermore, the tetraaryl substituents at the 4- and 9-bridging positions should not be as effective at solubilising the polymers as straight chain or branched chain alkyl substituents. In addition, the tetraaryl substituents should result in poorer solid-state packing of the polymer chains. This is because these aryl rings will twist of the plane of the polymer backbone due to steric interactions, and therefore should prevent the polymer chains from packing closely and result in lower charge carrier mobility.

SUMMARY OF THE INVENTION

The invention relates to conjugated polymers comprising one or more identical or different monomeric units of formula I

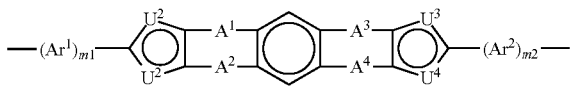

wherein
one of $A^1$ and $A^2$ is a single bond and the other is $CR^1R^2$,
one of $A^3$ and $A^4$ is a single bond and the other is $CR^3R^4$,
one of $U^1$ and $U^2$ is —CH= or =CH— and the other is —X—,
one of $U^3$ and $U^4$ is —CH= or =CH— and the other is —X—,
provided that if $A^i$ is a single bond then the corresponding $U^i$ is X (with i being an index from 1-4),
X is in each occurrence independently selected from —S— and —Se—,
$R^{1-4}$ are identical or different groups independently of each other selected from H, halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, P-Sp-, optionally substituted silyl, or carbyl or hydrocarbyl with 1 to 40 C atoms that is optionally substituted and optionally comprises one or more hetero atoms,
P is a polymerisable group,
Sp is a spacer group or a single bond,
$X^0$ is halogen,
$R^0$ and $R^{00}$ are independently of each other H or an optionally substituted carbyl or hydrocarbyl group optionally comprising one or more hetero atoms,
$Ar^1$ and $Ar^2$ are independently of each other an optionally substituted aryl or heterorayl group, —CY$^1$=CY$^2$— or —C≡C—,
$Y^1$ and $Y^2$ are independently of each other H, F, Cl or CN,
m1 and m2 are independently of each other 0 or 1, 2, 3 or 4.

The invention further relates to a formulation comprising one or more polymers or polymer blends according to the present invention and one or more solvents, preferably selected from organic solvents.

The invention further relates to a polymer blend comprising one or more polymers according to the present invention and one or more polymers, preferably selected from polymers having semiconducting, charge transport, hole/electron transport, hole/electron blocking, electrically conducting, photoconducting or light emitting properties.

The invention further relates to the use of polymers, polymer blends and formulations according to the present invention as charge transport, semiconducting, electrically conducting, photoconducting or light emitting material in optical, electrooptical, electronic, electroluminescent or photoluminescent components or devices.

The invention further relates to a charge transport, semiconducting, electrically conducting, photoconducting or light emitting material or component comprising one or more polymers, polymer blends of formulations according to the present invention.

The invention further relates to an optical, electrooptical or electronic component or device comprising one or more polymers, polymer blends, formulations, components or materials according to the present invention.

The optical, electrooptical, electronic electroluminescent and photoluminescent components or devices include, without limitation, organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), solar cells, laser diodes, photoconductors, photodetectors, electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

DETAILED DESCRIPTION OF THE INVENTION

The polymers according to the present invention exhibit several advantageous properties:
The s-indaceno[1,2-b:5,6-b']dithiophene unit exhibits a co-planar structure as confirmed by X-ray crystallographic analysis of a small molecule example described in ref. 3. Furthermore, individual polymer chains of the homopolymer, poly(2,7-s-indaceno[1,2-b:5,6-b']

dithiophene), should also adopt a highly co-planar structure in the solid-state given there are no substituents at the 3-position on the two terminal thiophenes that would otherwise result in sterically induced twisting of the polymer backbone. The homopolymer has the advantage of being more readily formulated and processed from solution, and the ability to organize into a closely packed thin-film morphology beneficial for charge transport.

The HOMO level for the homopolymer, poly(2,7-s-indaceno[1,2-b:5,6-b']dithiophene), is slightly elevated as compared to that of poly(2,8-indenofluorene) (PIF) whose HOMO level is low-lying ($E_{HOMO}$=−5.49 eV as measured by cyclic voltammetry). This results in improved charge-injection into the polymer semiconducting layer from the source-drain electrodes (typically made from gold, which has a workfunction of ~5.1 eV) when applied in field-effect transistor devices. Additionally, the HOMO level for the homopolymer is inherently lower than that of P3HT and other polythiophene materials, so that the polymer has improved oxidative stability.

Additional fine-tuning of the electronic energies (HOMO and LUMO levels) by either further direct modification of the electronic energies of the s-indaceno[1,2-b:5,6-b'] dithiophene core through electron-donating or electron-withdrawing substituents, or by co-polymerisation with appropriate electron-deficient co-monomer (e.g. benzothiadiazole) can afford low bandgap polymers that are advantageous in bulk heterojunction photovoltaic cells due to improved light harvesting. This gives way to higher bulk heterojunction cell efficiencies.

The conjugated polymers are preferably selected of formula II

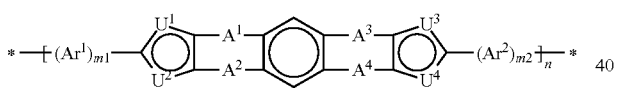

wherein $U^{1-4}$, $A^{1-4}$, $Ar^{1,2}$, m1 and m2 have the meanings of formula I and n is an integer >1.

Especially preferred are polymers of formula IIa

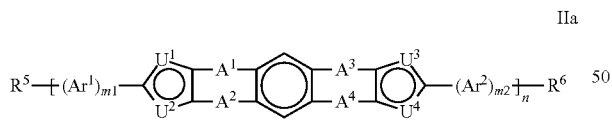

wherein $U^{1-4}$, $A^{1-4}$, $Ar^{1,2}$, m1, m2 and n have the meanings of formula II, and $R^5$ and $R^6$ have independently of each other one of the meanings of $R^1$ or denote H, halogen, —CH$_2$Cl, —CHO, —CH=CH$_2$, —SiR'R"R''', —SnR'R"R''', —BR'R", —B(OR')(OR"), —B(OH)$_2$, or P-Sp, wherein P and Sp are as defined above, and R', R" and R''' have independently of each other one of the meanings of $R^0$ given above and R' and R" may also form a ring together with the hetero atom to which they are attached.

Especially preferred are units of formula I and polymers of formula II and IIa, wherein X is S, $R^{1-4}$ are independently of each other selected from, preferably straight-chain or branched, $C_1$-$C_{20}$-alkyl, $C_1$-$C_{20}$-alkoxy, $C_2$-$C_{20}$-alkenyl, $C_2$-$C_{20}$-alkynyl, $C_1$-$C_{20}$-thioalkyl, $C_1$-$C_{20}$-silyl, $C_1$-$C_{20}$-ester, $C_1$-$C_{20}$-amino, and $C_1$-$C_{20}$-fluoroalkyl, $R^{1-4}$ are H, m1 and m2 are 0, m1 and m2 are 1 or 2, m2 is 0 and m1 is 1 or 2, $Ar^1$ and $Ar^2$ are independently of each other aryl or heteroaryl, preferably selected from the group consisting of 2,1,3-benzothiadiazole-4,7-diyl, 2,1,3-benzoselenadiazole-4,7-diyl, 2,3-dicyano-1,4-phenylene, 2,5-dicyano, 1,4-phenylene, 2,3-difluoro-1,4-phenylene, 2,5-difluoro, 1,4-phenylene, 2,3,5,6-tetrafluoro, 1,4-phenylene, 3,4-difluorothiophene-2,5-diyl, thieno[3,4-b]pyrazine-2,5-diyl, quinoxaline-5,8-diyl, selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, 1,4-phenylene, pyridine-2,5-diyl, pyrimidine-2,5-diyl, p-p'-biphenyl, naphthalene-2,6-diyl, benzo[1,2-b:4,5-b']dithiophene-2,6-diyl, 2,2-dithiophene, 2,2-diselenophene, thiazole and oxazole, all of which are unsubstituted, mono- or polysubstituted, preferably with $R^1$ as defined above, especially preferably with m being 1 or 2, n is an integer from 2 to 5,000, preferably from 10 to 5,000, very preferably from 100 to 1000, the molecular weight (Mw) is from 5,000 to 300,000, in particular from 20,000 to 200,000, $R^5$ and $R^6$ are selected from H, halogen, —CH$_2$Cl, —CHO, —CH=CH$_2$—SiR'R"R''', —SnR'R"R''', —BR'R", —B(OR')(OR"), —B(OH)$_2$, P-Sp, $C_1$-$C_{20}$-alkyl, $C_1$-$C_{20}$-alkoxy, $C_2$-$C_{20}$-alkenyl, $C_1$-$C_{20}$-fluoroalkyl and optionally substituted aryl or heteroaryl, at least one, preferably one or two of $R^{1-4}$ denote P-Sp-, The monomeric units of formula I are preferably selected from the group consisting of the following subformulae:

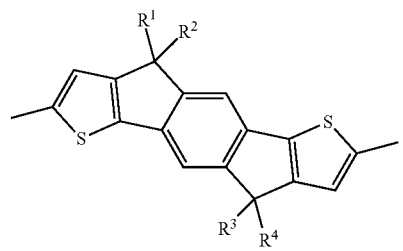

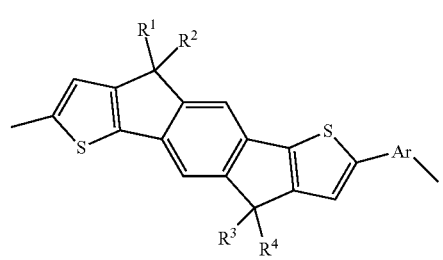

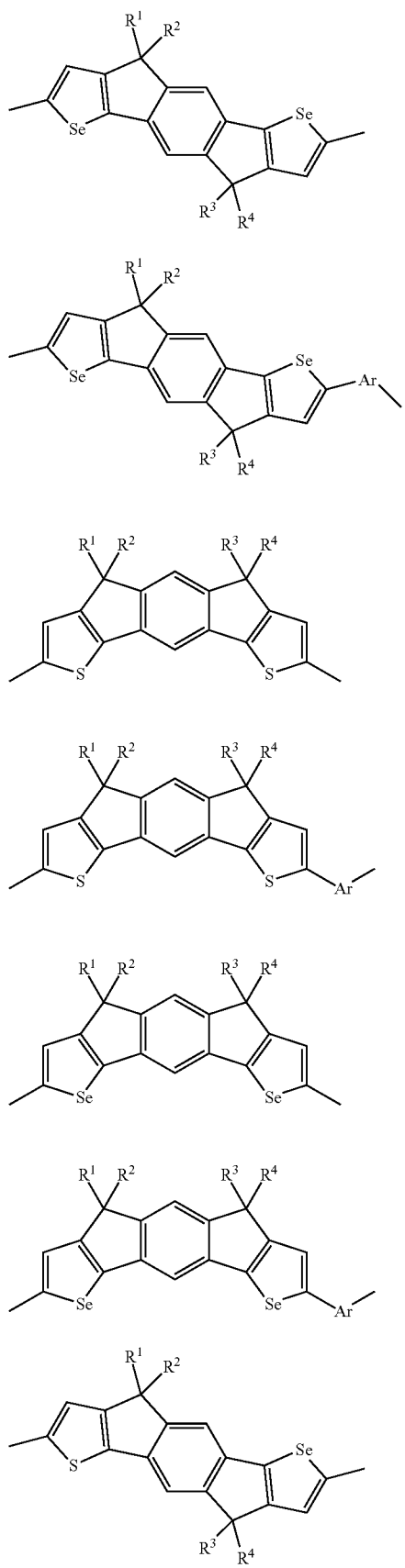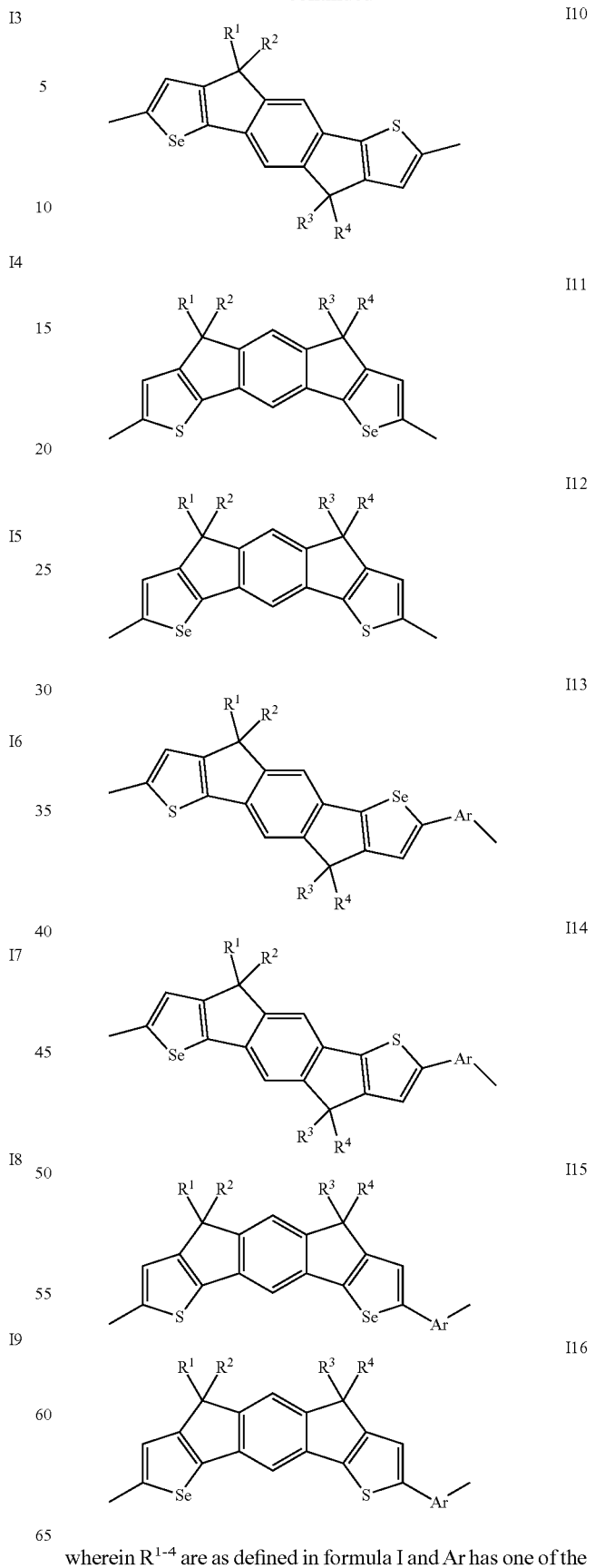
wherein $R^{1-4}$ are as defined in formula I and Ar has one of the meanings of $Ar^1$ given above and below.

Especially preferred are monomeric units of these subformulae wherein Ar is 2,1,3-benzothiadiazole-4,7-diyl or 2,1,3-benzoselenadiazole-4,7-diyl, in particular those of formula I2, I4, I13 and I14.

The polymers of the present invention preferably comprise, very preferably consist of, one or more identical or different monomeric units selected from the group consisting of subformulae I1-I16.

The polymers of the present invention include homopolymers and copolymers, like statistical or random copolymers, alternating copolymers and block copolymers, as well as combinations thereof.

The polymers of formula II are preferably selected from the group consisting of the following subformulae:

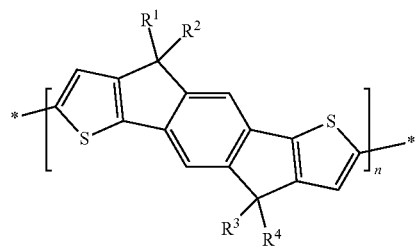

II1

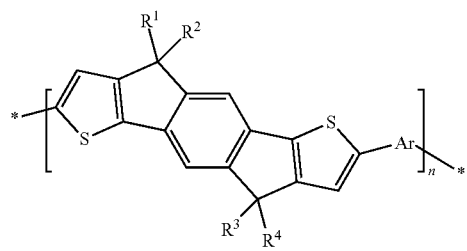

II2

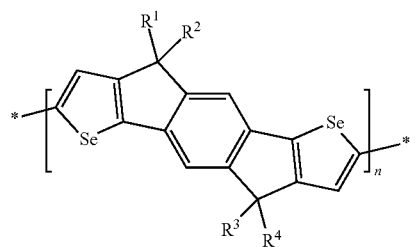

II3

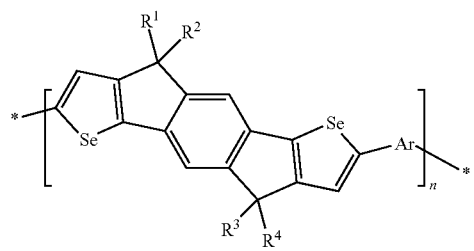

II4

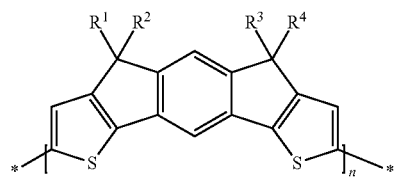

II5

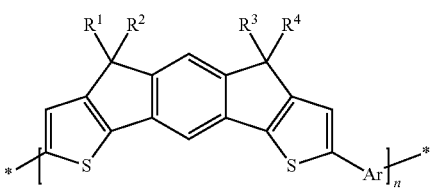

II6

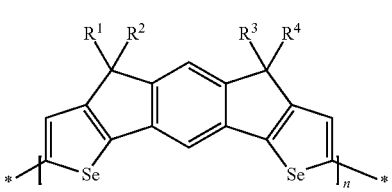

II7

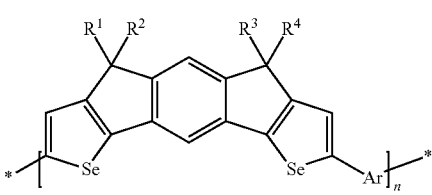

II8

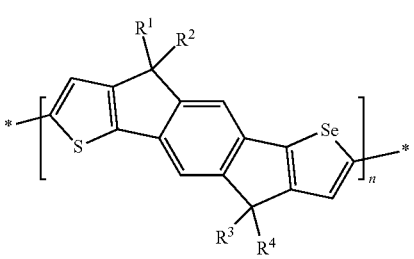

II9

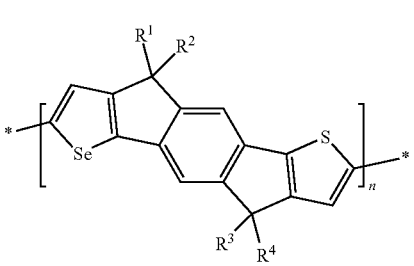

II10

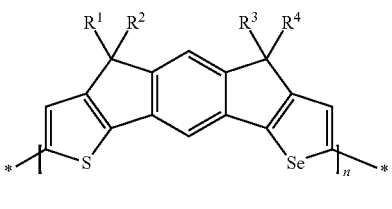

II11

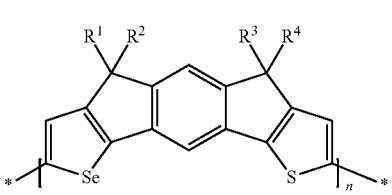

II12

-continued

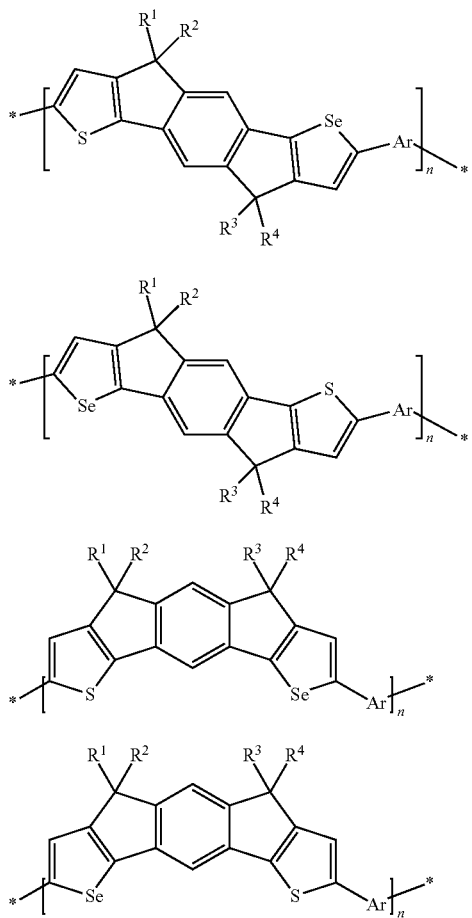

wherein R$^{1-4}$ and n are as defined in formula II and Ar has one of the meanings of Ar$^1$ given above and below.

Especially preferred are polymers of these subformulae wherein Ar is 2,1,3-benzothiadiazole-4,7-diyl or 2,1,3-benzoselenadiazole-4,7-diyl, in particular those of formula I2, I4, I13 and I14.

Especially preferred are polymers of the following formula:

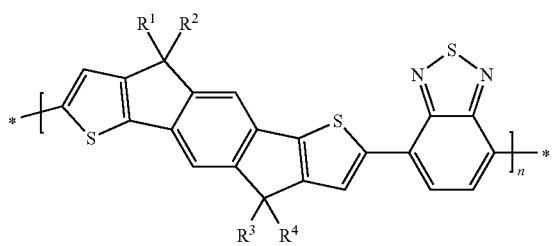

II2a wherein R has one of the meanings of R$^1$ as given above, and is preferably selected from the group consisting of C$_1$-C$_{20}$-alkyl, C$_1$-C$_{20}$-alkoxy, C$_2$-C$_{20}$-alkenyl, C$_2$-C$_{20}$-alkynyl, C$_1$-C$_{20}$-thioalkyl, C$_1$-C$_{20}$-silyl, C$_1$-C$_{20}$-ester, C$_1$-C$_{20}$-amino, and C$_1$-C$_{20}$-fluoroalkyl, all of which are straight-chain or branched.

Further preferred are polymers of formula IIa1:

$$R^5\text{-chain-}R^6 \qquad \text{IIa1}$$

wherein R$^5$ and R$^6$ are as defined in formula IIa, and "chain" is a polymer chain selected from the group consisting of subformulae II1-II10 and II2a.

In the polymers according to the present invention, the total number of repeating units n is preferably ≥10, very preferably ≥20, most preferably ≥50, and preferably up to 500, very preferably up to 1,000, most preferably up to 2,000, including any combination of the aforementioned lower and upper limits of n.

The term "polymer" generally means a molecule of high relative molecular mass, the structure of which essentially comprises the multiple repetition of units derived, actually or conceptually, from molecules of low relative molecular mass (PAC, 1996, 68, 2291). The term "oligomer" generally means a molecule of intermediate relative molecular mass, the structure of which essentially comprises a small plurality of units derived, actually or conceptually, from molecules of lower relative molecular mass (PAC, 1996, 68, 2291). In a preferred sense according to the present invention a polymer means a compound having >1, preferably >10 repeating units, and an oligomer means a compound with >1 and <20, preferably 10, repeating units.

The term "repeating unit" means the constitutional repeating unit (CRU), which is the smallest constitutional unit the repetition of which constitutes a regular macromolecule, a regular oligomer molecule, a regular block or a regular chain (PAC, 1996, 68, 2291).

The term "leaving group" means an atom or group (charged or uncharged) that becomes detached from an atom in what is considered to be the residual or main part of the molecule taking part in a specified reaction (see also PAC, 1994, 66, 1134).

The term "conjugated" means a compound containing mainly C atoms with sp$^2$-hybridisation (or optionally also sp-hybridisation), which may also be replaced by hetero atoms. In the simplest case this is for example a compound with alternating C—C single and double (or triple) bonds, but does also include compounds with units like 1,3-phenylene. "Mainly" means in this connection that a compound with naturally (spontaneously) occurring defects, which may lead to interruption of the conjugation, is still regarded as a conjugated compound.

Unless stated otherwise, the molecular weight is given as the number average molecular weight M$_n$ or weight average molecular weight M$_w$, which is determined by gel permeation chromatography (GPC) against polystyrene standards. The degree of polymerization (n) means the number average degree of polymerization, given as n=M$_n$/M$_u$, wherein M$_U$ is the molecular weight of the single repeating unit.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may also be linear, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be linear or branched. The $C_1$-$C_{40}$ carbyl or hydrocarbyl group includes for example: a $C_1$-$C_{40}$ alkyl group, a $C_2$-$C_{40}$ alkenyl group, a $C_2$-$C_{40}$ alkynyl group, a $C_3$-$C_{40}$ alkyl group, a $C_4$-$C_{40}$ alkyldienyl group, a $C_4$-$C_{40}$ polyenyl group, a $C_6$-$C_{18}$ aryl group, a $C_2$-$C_{18}$ heteroaryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ alkyl group, a $C_4$-$C_{20}$ alkyldienyl group, a $C_6$-$C_{12}$ aryl group, a $C_2$-$C_{12}$ heteroaryl group and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

Further preferred carbyl and hydrocarbyl groups include straight-chain, branched or cyclic alkyl with 1 to 40, preferably 1 to 25 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —NR$^0$—, —SiR$^0$R$^{00}$—, —CO—, —COO—, —OCO—, —O—CO—O—, —S—CO—, —CO—S—, —SO$_2$—, —CO—NR$^0$—, —NR$^0$—CO—, —NR$^0$—CO—NR$^{00}$—, —CY$^1$=CY$^2$— or —C≡C— in such a manner that O and/or S atoms are not linked directly to one another, wherein Y$^1$ and Y$^2$ are independently of each other H, F, Cl or CN, and R$^0$ and R$^{00}$ are independently of each other H or an optionally substituted aliphatic or aromatic hydrocarbon with 1 to 20 C atoms.

R$^0$ and R$^{00}$ are preferably selected from H, straight-chain or branched alkyl with 1 to 12 C atoms or aryl with 6 to 12 C atoms.

—CY$^1$=CY$^2$— is preferably —CH=CH—, —CF=CF— or —CH=C(CN)—.

Halogen is F, Cl, Br or I.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, tetradecyl, hexadecyl, trifluoromethyl, perfluoro-n-butyl, 2,2,2-trifluoroethyl, perfluorooctyl, perfluorohexyl etc.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl etc.

Preferred alkynyl groups include, without limitation, ethynyl, propynyl, butynyl, pentynyl, hexynyl, octynyl etc.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy etc.

Preferred amino groups include, without limitation, dimethylamino, methylamino, methylphenylamino, phenylamino, etc.

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is substantially conjugated over substantially the whole group.

Aryl and heteroaryl preferably denote a mono-, bi- or tricyclic aromatic or heteroaromatic group with up to 25 C atoms that may also comprise condensed rings and is optionally substituted.

Preferred aryl groups include, without limitation, benzene, biphenylene, triphenylene, [1,1':3',1"]terphenyl-2'-ylene, naphthalene, anthracene, binaphthylene, phenanthrene, pyrene, dihydropyrene, chrysene, perylene, tetracene, pentacene, benzpyrene, fluorene, indene, indenofluorene, spirobifluorene, etc.

Preferred heteroaryl groups include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like carbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, dithienopyridine, isobenzothiophene, dibenzothiophene, benzothiadiazothiophene, or combinations thereof. The heteroaryl groups may be substituted with alkyl, alkoxy, thioalkyl, fluoro, fluoroalkyl or further aryl or heteroaryl substituents.

Preferred arylalkyl groups include, without limitation, 2-tolyl, 3-tolyl, 4-tolyl, 2,6-dimethylphenyl, 2,6-diethylphenyl, 2,6-di-i-propylphenyl, 2,6-di-t-butylphenyl, o-t-butylphenyl, m-t-butylphenyl, p-t-butylphenyl, 4-phenoxyphenyl, 4-fluorophenyl, 3-carbomethoxyphenyl, 4-carbomethoxyphenyl etc.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy etc.

The aryl, heteroaryl, carbyl and hydrocarbyl groups optionally comprise one or more substituents, preferably selected from silyl, sulpho, sulphonyl, formyl, amino, imino, nitrilo, mercapto, cyano, nitro, halogen, $C_{1-12}$alkyl, $C_{6-12}$aryl, $C_{1-12}$ alkoxy, hydroxy and/or combinations thereof. The optional substituents may comprise all chemically possible combinations in the same group and/or a plurality (preferably two) of the aforementioned groups (for example amino and sulphonyl if directly attached to each other represent a sulphamoyl radical).

Preferred substituents include, without limitation, F, Cl, Br, I, —CN, —NO$_2$, —NCO, —NCS, —OCN, —SCN, —C(=O)NR$^0$R$^{00}$, —C(=O)X$^0$, —C(=O)R$^0$, —NR$^0$R$^{00}$, optionally substituted silyl, aryl with 6 to 40, preferably 6 to 20 C atoms, heteroaryl with 2 to 40, preferably 2 to 20 C atoms, and straight chain or branched alkyl, alkoxy, alkylcarbonyl, alkoxy-carbonyl, alkylcarbonlyoxy or alkoxycarbonyloxy with 1 to 20, preferably 1 to 12 C atoms, wherein one or more H atoms are optionally replaced by F or Cl, wherein R$^0$ and R$^{00}$ are as defined above and X$^0$ is halogen.

Especially preferred substituents are selected from alkyl, alkoxy, alkenyl, oxaalkyl, thioalkyl, fluoroalkyl and fluoroalkoxy groups as defined for the preferred groups R$^{1,2}$ below.

If one of R$^{1-4}$ is an alkyl or alkoxy radical, i.e. where the terminal CH$_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example. Especially preferred are n-hexyl and n-dodecyl.

If one of R$^{1-4}$ is an alkyl group wherein one or more CH$_2$ groups are replaced by —CH=CH—, this may be straight-chain or branched. It is preferably straight-chain, has 2 to 12 C-atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl, undec-1-, 2-, 3-, 4-, 5-, 6-, 7-, 8-, 9- or undec-10-enyl, dodec-1-, 2-, 3-, 4-, 5-, 6-, 7-, 8-, -9, -10 or undec-11-enyl. The alkenyl group may comprise C=C-bonds with E- or Z-configuration or a mixture thereof.

If one of R$^{1-4}$ is oxaalkyl, i.e. where one CH$_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

If one of R$^{1-4}$ is thioalkyl, i.e. where one CH$_2$ group is replaced by —S—, is preferably straight-chain thiomethyl (—SCH$_3$), 1-thioethyl (—SCH$_2$CH$_3$), 1-thiopropyl (=—SCH$_2$CH$_2$CH$_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the CH$_2$ group adjacent to the sp$^2$ hybridised vinyl carbon atom is replaced.

If one of R$^{1-4}$ is fluoroalkyl or fluoroalkoxy, it is preferably a straight-chain group (O)C$_i$F$_{2i+1}$, wherein i is an integer from 1 to 15, in particular CF$_3$, C$_2$F$_5$, C$_3$F$_7$, C$_4$F$_9$, C$_5$F$_{11}$, C$_6$F$_{13}$, C$_7$F$_{15}$ or C$_8$F$_{17}$, very preferably C$_6$F$_{13}$, or the corresponding fluoroalkoxy group.

The polymers may also be substituted with a polymerisable or reactive group, which is optionally protected during the process of forming the polymer. Particular preferred polymers of this type are those of formula I wherein R$^1$ denotes P-Sp. These polymers are particularly useful as semiconductors or charge transport materials, as they can be crosslinked via the groups P, for example by polymerisation in situ, during or after processing the polymer into a thin film for a semiconductor component, to yield crosslinked polymer films with high charge carrier mobility and high thermal, mechanical and chemical stability.

Preferably the polymerisable or reactive group P is selected from CH$_2$=CW$^1$—COO—, CH$_2$=CW$^1$—CO—,

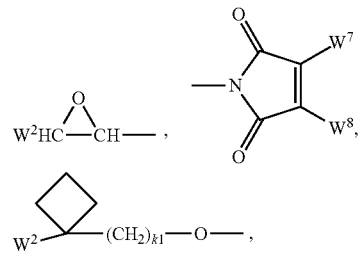

CH$_2$=CW$^2$—(O)$_{k1}$—, CH$_3$—CH=CH—O—, (CH$_2$=CH)$_2$CH—OCO—, (CH$_2$=CH—CH$_2$)$_2$CH—OCO—, (CH$_2$=CH)$_2$CH—O—, (CH$_2$=CH—CH$_2$)$_2$N—, (CH$_2$=CH—CH$_2$)$_2$N—CO—, HO—CW$^2$W$^3$—, HS—CW$^2$W$^3$—, HW$^2$N—, HO—CW$^2$W$^3$—NH—, CH$_2$=CW$^1$—CO—NH—, CH$_2$=CH—(COO)$_{k1}$-Phe-(O)$_{k2}$—, CH$_2$=CH—(CO)$_{k1}$-Phe-(O)$_{k2}$—, Phe-CH=CH—, HOOC—, OCN—, and W$^4$W$^5$W$^6$Si—, with W$^1$ being H, F, Cl, CN, CF$_3$, phenyl or alkyl with 1 to 5 C-atoms, in particular H, C$_1$ or CH$_3$, W$^2$ and W$^3$ being independently of each other H or alkyl with 1 to 5 C-atoms, in particular H, methyl, ethyl or n-propyl, W$^4$, W$^5$ and W$^6$ being independently of each other Cl, oxaalkyl or oxacarbonylalkyl with 1 to 5 C-atoms, W$^7$ and W$^8$ being independently of each other H, Cl or alkyl with 1 to 5 C-atoms, Phe being 1,4-phenylene that is optionally substituted by one or more groups L as defined above, and k$_1$ and k$_2$ being independently of each other 0 or 1.

Alternatively P is a protected derivative of these groups which is non-reactive under the conditions described for the process according to the present invention. Suitable protective groups are known to the ordinary expert and described in the literature, for example in Green, "Protective Groups in Organic Synthesis", John Wiley and Sons, New York (1981), like for example acetals or ketals.

Especially preferred groups P are CH$_2$=CH—COO—, CH$_2$=C(CH$_3$)—COO—, CH$_2$=CH—, CH$_2$=CH—O—, (CH$_2$=CH)$_2$CH—OCO—, (CH$_2$=CH)$_2$CH—O—,

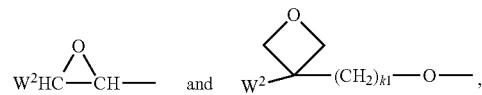

or protected derivatives thereof.

Polymerisation of group P can be carried out according to methods that are known to the ordinary expert and described in the literature, for example in D. J. Broer; G. Challa; G. N. Mol, *Macromol. Chem.*, 1991, 192, 59.

The term "spacer group" is known in prior art and suitable spacer groups Sp are known to the ordinary expert (see e.g. Pure Appl. Chem. 73 (5), 888 (2001). The spacer group Sp is preferably of formula Sp'-X', such that P-Sp- is P-Sp'-X'—, wherein Sp' is alkylene with up to 30 C atoms which is unsubstituted or mono- or polysubstituted by F, Cl, Br, I or CN, it being also possible for one or more non-adjacent CH$_2$ groups to be replaced, in each case independently from one another, by —O—, —S—, —NH—, —NR⁰—, —SiR⁰R⁰⁰—, —CO—, —COO—, —OCO—, —OCO—O—, —S—CO—, —CO—S—, —CH═CH— or —C≡C— in such a manner that O and/or S atoms are not linked directly to one another, X' is —O—, —S—, —CO—, —COO—, —OCO—, —O—COO—, —CO—NR⁰—, —NR⁰—CO—, —NR⁰—CO—NR⁰⁰—, —OCH₂—, —CH₂O—, —SCH₂—, —CH₂S—, —CF₂O—, —OCF₂—, —CF₂S—, —SCF₂—, —CF₂CH₂—, —CH₂CF₂—, —CF₂CF₂—, —CH═N—, —N═CH—, —N═N—, —CH═CR⁰—, —CY¹═CY²—, —C≡C—, —CH═CH—COO—, —OCO—CH═CH— or a single bond, R⁰ and R⁰⁰ are independently of each other H or alkyl with 1 to 12 C-atoms, and Y¹ and Y² are independently of each other H, F, Cl or CN.

X' is preferably —O—, —S—, —OCH₂—, —CH₂O—, —SCH₂—, —CH₂S—, —CF₂O—, —OCF₂—, —CF₂S—, —SCF₂—, —CH₂CH₂—, —CF₂CH₂—, —CH₂CF₂—, —CF₂CF₂—, —CH═N—, —N═CH—, —N═N—, —CH═CR⁰—, —CY¹═CY²—, —C≡C— or a single bond, in particular —O—, —S—, —C≡C—, —CY¹═CY²— or a single bond. In another preferred embodiment X' is a group that is able to form a conjugated system, such as —C≡C— or —CY¹═CY²—, or a single bond.

Typical groups Sp' are, for example, —(CH₂)ₚ—, —(CH₂CH₂O)q—CH₂CH₂—, —CH₂CH₂—S—CH₂CH₂— or —CH₂CH₂—NH—CH₂CH₂— or —(SiR⁰R⁰⁰—O)ₚ—, with p being an integer from 2 to 12, q being an integer from 1 to 3 and R⁰ and R⁰⁰ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

The polymers of the present invention can be synthesized according to or in analogy to methods that are known to the skilled person and are described in the literature. Other methods of preparation can be taken from the examples. For example, they can be suitably prepared by aryl-aryl coupling reactions, such as Yamamoto coupling, Suzuki coupling, Stille coupling, Sonogashira coupling or Heck coupling. Suzuki coupling and Yamamoto coupling are especially preferred.

The monomers which are polymerised to form the repeat units of the polymers can be prepared according to methods which are known to the person skilled in the art.

Preferably the polymers are prepared from monomers of formula Ia

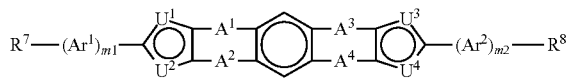

Ia wherein U¹⁻⁴, A¹⁻⁴, Ar¹,², m1 and m2 have the meanings given above, and R⁷ and R⁸ are, preferably independently of each other, selected from the group consisting of Cl, Br, I, O-tosylate, O-triflate, O-mesylate, O-nonaflate, —SiMe₂F, —SiMeF₂, —O—SO₂Z, —B(OZ¹)₂, —CZ²═C(Z²)₂, —C≡CH and —Sn(Z³)₃, wherein Z and Z¹⁻³ are selected from the group consisting of alkyl and aryl, each being optionally substituted, and two groups Z¹ may also form a cyclic group.

The novel monomers of formula Ia are another aspect of the invention.

Another aspect of the invention is a process for preparing a polymer by coupling one or more identical or different monomers based on a unit of formula I with each other in a polymerisation reaction.

Another aspect of the invention is a process for preparing a polymer by coupling one or more identical or different monomers based on a unit of formula I, preferably selected of formula Ia, with each other and/or with one or more comonomers, in a polymerisation reaction, preferably an aryl-aryl coupling reaction.

Suitable and preferred comonomers are those of the following formulae

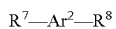

wherein Ar¹, Ar², R⁷ and R⁸ are as defined in formula Ia.

Preferred methods for polymerisation are those leading to C—C-coupling or C—N-coupling, like Suzuki polymerisation, as described for example in WO 00/53656, Yamamoto polymerisation, as described in for example in T. Yamamoto et al., Progress in Polymer Science 1993, 17, 1153-1205 or in WO 2004/022626 A1, and Stille coupling. For example, when synthesizing a linear polymer by Yamamoto polymerisation, monomers as described above having two reactive halide groups R⁷,⁸ is preferably used. When synthesizing a linear polymer by Suzuki polymerisation, preferably a monomer as described above is used wherein at least one reactive group R⁷,⁸ is a boronic acid or boronic acid derivative group.

Suzuki polymerisation may be used to prepare homopolymers as well as statistical, alternating and block random copolymers. Statistical or block copolymers can be prepared for example from the above monomers of formula II wherein one of the reactive groups R⁷ and R⁸ is halogen and the other reactive group is a boronic acid or boronic acid derivative group. The synthesis of statistical, alternating and block copolymers is described in detail for example in WO 03/048225 A2 or WO 2005/014688 A2.

Suzuki polymerisation employs a Pd(0) complex or a Pd(II) salt. Preferred Pd(0) complexes are those bearing at least one phosphine ligand such as Pd(Ph₃P)₄. Another preferred phosphine ligand is tris(ortho-tolyl)phosphine, i.e. Pd(o-Tol)₄. Preferred Pd(II) salts include palladium acetate, i.e. Pd(OAc)₂. Suzuki polymerisation is performed in the presence of a base, for example sodium carbonate, potassium phosphate or an organic base such as tetraethylammonium carbonate. Yamamoto polymerisation employs a Ni(0) complex, for example bis(1,5-cyclooctadienyl) nickel(0).

As alternatives to halogens as described above, leaving groups of formula —O—SO₂Z can be used wherein Z is as described above. Particular examples of such leaving groups are tosylate, mesylate and triflate.

Especially suitable and preferred synthesis methods of the monomer units and monomers of formula I and Ia and their homo- and co-polymers of formula II and IIa are illustrated in the synthesis schemes shown hereinafter. Therein R has one of the meanings of R¹ given in formula I.

A preferred synthesis of 4,4,9,9-tetraalkyl s-indaceno[1,2-b:5,6-b']dithiophene is exemplarily illustrated in Scheme 1.

Scheme 1

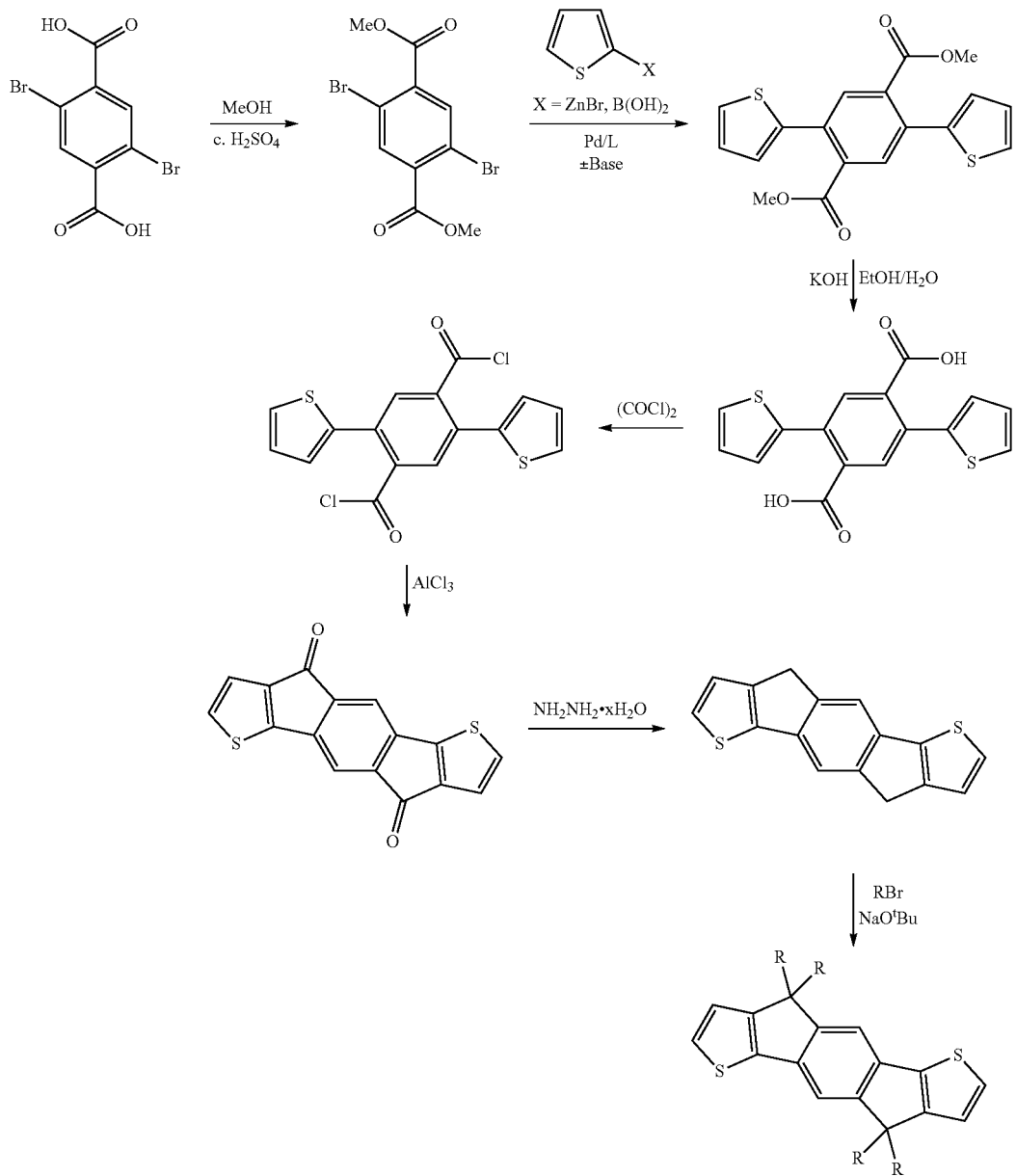

The corresponding s-indaceno[1,2-b:5,6-b']diselenophene compounds can be prepared in analogous manner by using a 2-substituted selenophene educt instead of a 2-substituted thiophene in the second reaction step shown above.

Accordingly, the corresponding "mixed" indaceno compounds with one thiophene and one selenophene ring, like e.g. those of formula I9 or I13 above, can be prepared according to the second reaction step in Scheme 1, but in two individual stages. Firstly, a reaction of a 2-substituted thiophene educt and isolation of the intermediate product, followed by a second reaction of a 2-substituted selenophene to yield the "mixed" product.

The functionalisation of 4,4,9,9-tetraalkyl s-indaceno[1,2-b:5,6-b']dithiophene is exemplarily illustrated in Scheme 2.

Scheme 2

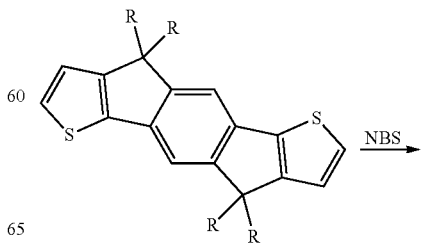

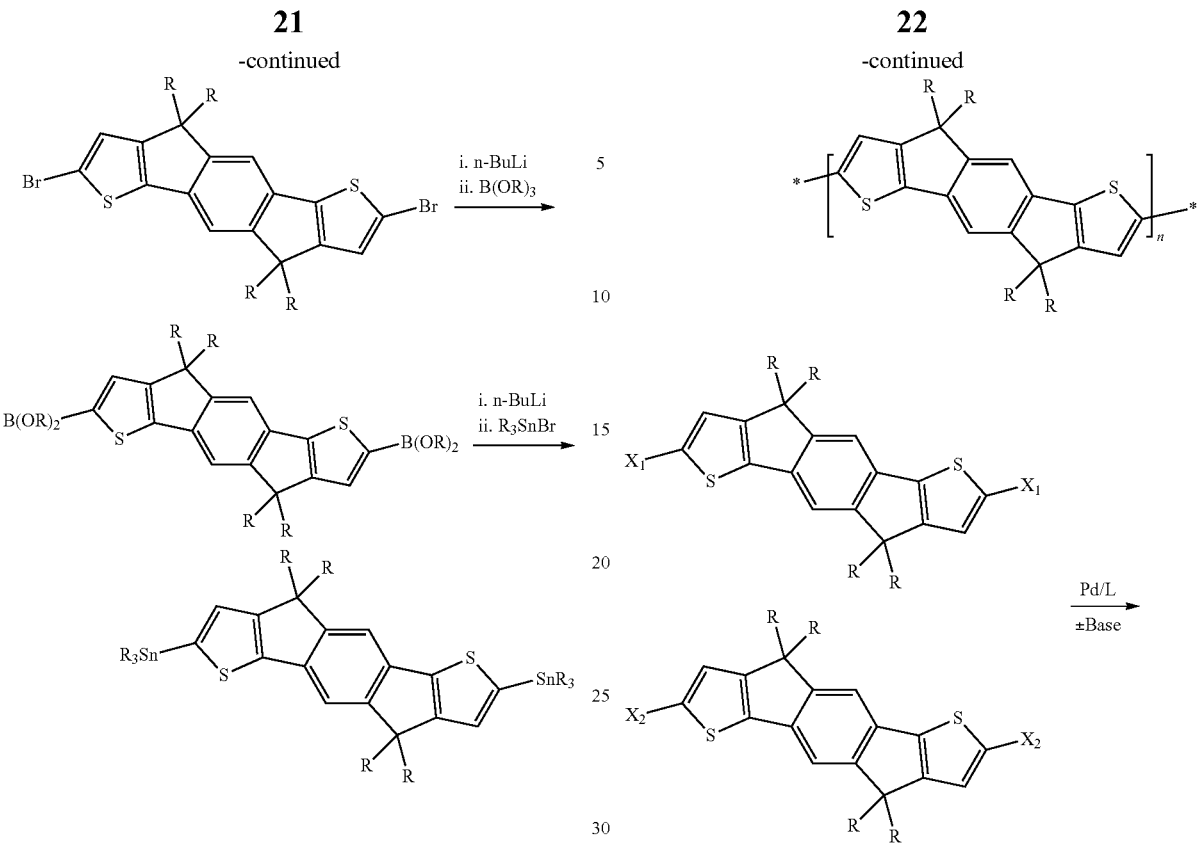
The homopolymerisation of 4,4,9,9-tetraalkyl s-indaceno[1,2-b:5,6-b']dithiophene is exemplarily illustrated in Scheme 3.
Scheme 3
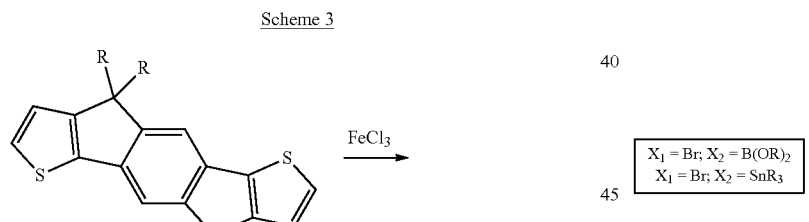
The co-polymerisation of 4,4,9,9-tetraalkyl s-indaceno[1,2-b:5,6-b']dithiophene is exemplarily illustrated in Scheme 4.
Scheme 4
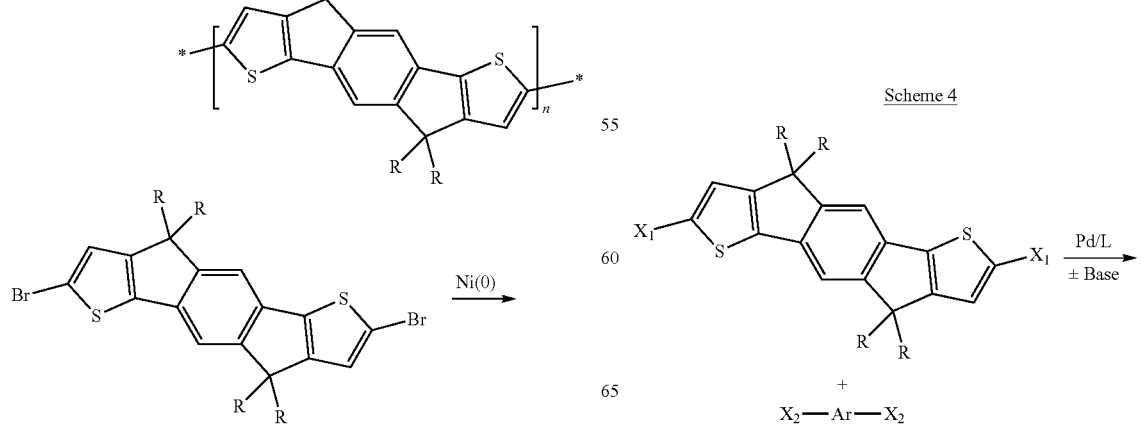

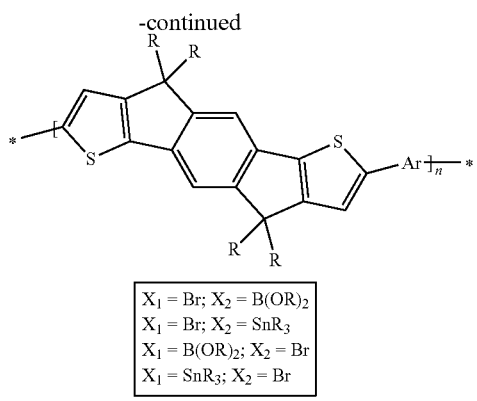

X₁ = Br; X₂ = B(OR)₂
X₁ = Br; X₂ = SnR₃
X₁ = B(OR)₂; X₂ = Br
X₁ = SnR₃; X₂ = Br

The s-indaceno[1,2-b:7,6-b']dithiophene/selenophene compounds can be prepared as illustrated in Scheme 5.

Scheme 5

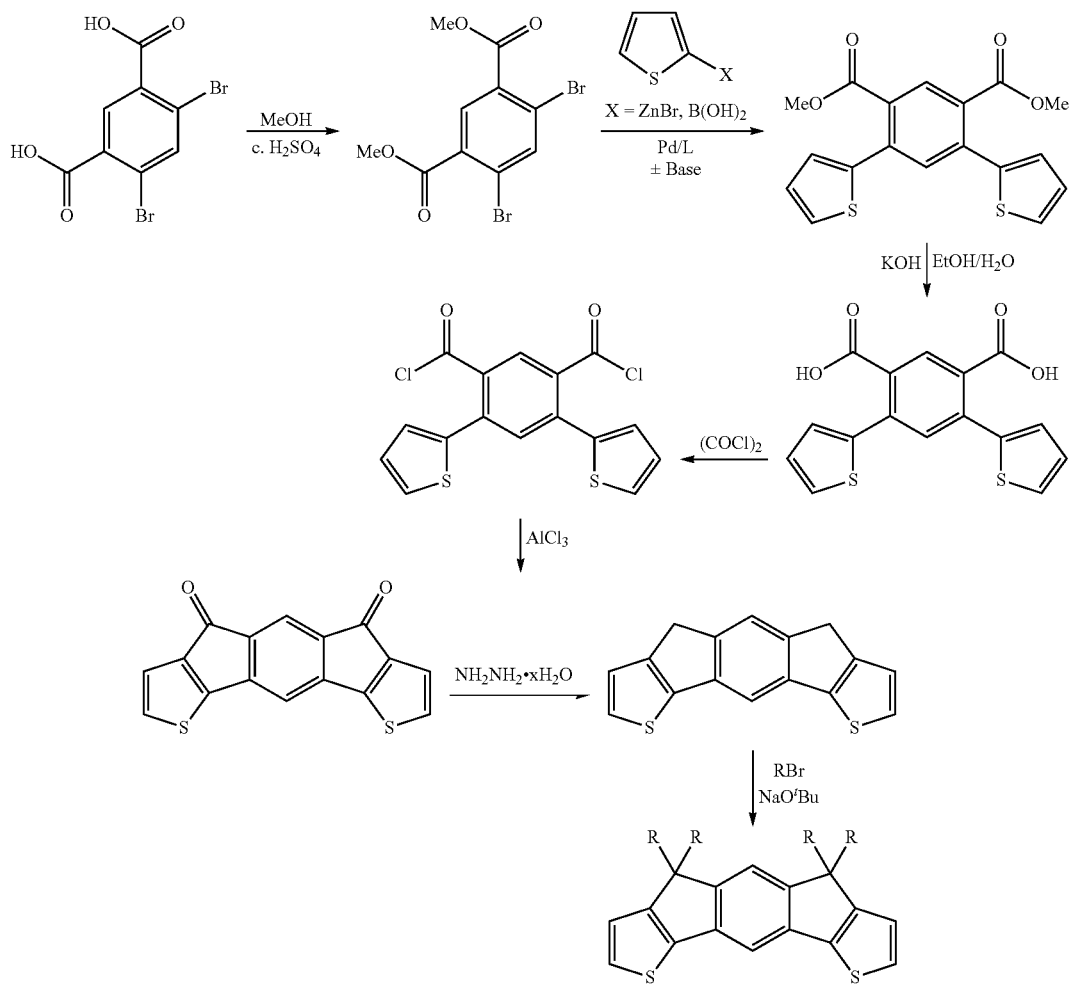

The novel methods of preparing polymers as described above and below are another aspect of the invention.

The polymers according to the present invention are useful as charge transport, semiconducting, electrically conducting, photoconducting or light emitting materials in optical, electrooptical, electronic, electroluminescent or photoluminescent components or devices.

Especially preferred devices are OFETs, TFTs, ICs, logic circuits, capacitors, RFID tags, OLEDs, OLETs, OPVs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns. In these devices, the polymers of the present invention are typically applied as thin layers or films.

OFETs where an organic semiconducting (OSC) material is arranged as a thin film between a gate dielectric and a drain and a source electrode, are generally known, and are described for example in U.S. Pat. No. 5,892,244, WO 00/79617, U.S. Pat. No. 5,998,804, and in the references cited in the background section. Due to the advantages, like low cost production using the solubility properties of the polymers according to the invention and thus the processibility of large surfaces, preferred applications of these FETs are such as integrated circuitry, TFT displays and security applications.

The polymers according to the present invention can also be used in polymer blends, for example together with other polymers having charge-transport, semiconducting, electrically conducting, photoconducting and/or light emitting semiconducting properties, or for example with polymers having hole blocking or electron blocking properties for use as interlayers or charge blocking layers in OLED devices. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more polymers or polymer blends as described above and below and one or more organic solvents.

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and/or mixtures thereof.

The concentration of the polymers in the solution is preferably 0.1 to 10% by weight, more preferably 0.5 to 5% by weight. Optionally, the solution also comprises one or more binders to adjust the rheological properties, as described for example in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

The polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared.

Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymers or formulations according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

An OFET device according to the present invention preferably comprises:
a source electrode,
a drain electrode,
a gate electrode,
an organic semiconducting (OSC) layer,
one or more gate insulator layers,
optionally a substrate,
wherein the OSC layer comprises one or more polymers according to the present invention.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer. The OFET device can be a top gate device or a bottom gate device. Suitable structures and manufacturing methods of an OFET device are known to the skilled in the art and are described in the literature, for example in WO 03/052841.

An OPV device according to the present invention preferably comprises:
- a low work function electrode (for example Aluminum),
- a high work function electrode (for example ITO), one of which is transparent,
- a bilayer of consisting of a hole transporting and an electron transporting material; the bilayer can exist as two distinct layers, or a blended mixture (see for example Coakley, K. M. and McGehee, M. D. Chem. Mater. 2004, 16, 4533),
- an optional conducting polymer layer (such as for example PEDOT:PSS) to modify the work function of the high work function electrode to provide an ohmic contact for the hole,
- an optional coating on the high workfunction electrode (such as LiF) to provide an ohmic contact for electrons.

The hole transporting polymer in the blend exists of one of the polymers of the present invention. The electron transporting material can be an inorganic material such as zinc oxide or cadmium selenide, or an organic material such as a fullerene derivate (for example PCBM, [(6,6)-phenyl C61-butyric acid methyl ester] or a polymer see for example Coakley, K. M. and McGehee, M. D. Chem. Mater. 2004, 16, 4533). If the bilayer is a blend an optional annealing step may be necessary to optimize device performance.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetary value, like stamps, tickets, shares, cheques etc.

Alternatively, the materials according to the invention can be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the materials according to the present invention, especially those which show photoluminescent properties, may be employed as materials of light sources, e.g., of display devices such as described in EP 0 889 350 A1 or by C. Weder et al., Science, 279, 1998, 835-837.

A further aspect of the invention relates to both the oxidised and reduced form of the polymers according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)(SbF_6^-)$, $(NO_2^+)$ $(SbCl_6^-)$, $(NO_2^+)(BF_4^-)$, $AgClO_4$, $H_2IrCl_6$, La $(NO_3)_3.6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the polymers of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913.

According to another use the materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, Proc. Natl. Acad. Sci. U.S.A. 1999, 96, 12287; D. Wang, X. Gong, P. S. Heeger, F. Rininsland, G. C. Bazan and A. J. Heeger, Proc. Natl. Acad. Sci. U.S.A. 2002, 99, 49; N. DiCesare, M. R. Pinot, K. S. Schanze and J. R. Lakowicz, Langmuir 2002, 18, 7785; D. T. McQuade, A. E. Pullen, T. M. Swager, Chem. Rev. 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention will now be described in more detail by reference to the following examples, which are illustrative only and do not limit the scope of the invention.

Example 1

Preparation of 2,5-dithien-2-ylterephthalic acid dimethyl ester

Dimethyl 2,5-dibromoterephthalate (6.09 g, 17.30 mmol) is dissolved in anhydrous THF (100 cm$^3$), followed by the addition of 2-thienylzinc bromide (0.50 M in THF, 90 cm$^3$, 45.0 mmol) and Pd(PPh$_3$)$_4$ (0.50 g, 0.43 mmol). The mixture is heated at 67° C. for 2 hours. After cooling, the reaction mixture is poured into water. The precipitate is collected by filtration and washed with water, methanol and diethyl ether then dried in vacuo, to yield the product as a pale yellow solid (5.41 g, 87%). $^1$H NMR (300 MHz, CDCl$_3$): δ(ppm) 7.82 (s, 2H, Ar—H), 7.40 (dd, J=4.8 and 1.4 Hz, 2H, Ar—H), 7.07-7.12 (m, 4H, Ar—H), 3.78 (s, 6H, CH$_3$); $^{13}$C NMR (75 MHz, CDCl$_3$): δ(ppm) 168.1 (C=O), 140.3 (q), 133.6 (q), 133.4 (q), 131.9 (CH), 127.5 (CH), 127.0 (CH), 126.7 (CH), 52.6 (CH$_3$); MS (m/e): 358 (M$^+$, 100%), 327, 299, 240, 195.

Preparation of 2,5-dithien-2-ylterephthalic acid

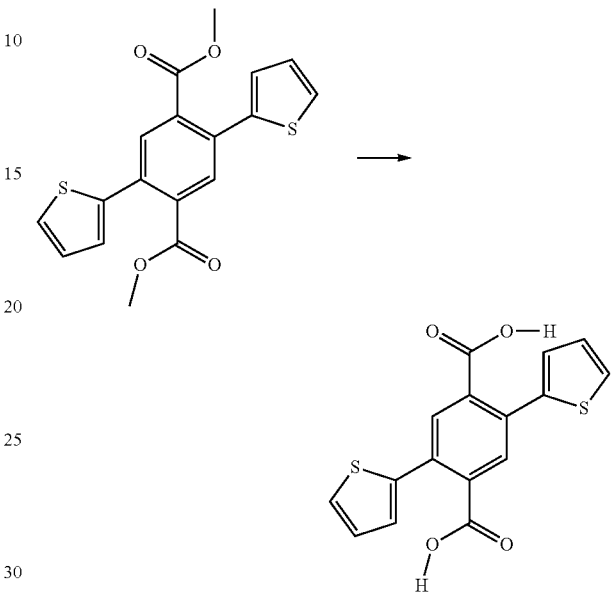

Sodium hydroxide (4.80 g, 120.0 mmol) is dissolved in water (30 cm$^3$), then ethanol (250 cm$^3$) and 2,5-dithien-2-ylterephthalic acid dimethyl ester (5.30 g, 14.8 mmol) are added. This mixture is heated at 78° C. overnight. The solvent is evaporated under reduced pressure to about half of original volume then water is added. The resultant mixture is neutralized with concentrated hydrochloric acid. The precipitate is collected by filtration and washed with water and ethanol, then dried in vacuo, to yield the product as an off-white solid (4.13 g, 84%). $^1$H NMR (300 MHz, DMSO-d$_6$): δ(ppm) 13.46 (s, 2H, COOH), 7.72 (s, 2H, Ar—H), 7.70 (dd, J=5.1 and 1.1 Hz, 2H, Ar—H), 7.28 (dd, J=3.6 and 1.1 Hz, 2H, Ar—H), 7.17 (m, 2H, Ar—H); $^{13}$C NMR (75 MHz, DMSO-d$_6$): δ(ppm) 168.7 (C=O), 139.7 (q), 134.5 (q), 131.4 (q), 130.2 (CH), 127.9 (CH), 127.5 (CH), 127.1 (CH).

Preparation of 2,5-dithien-2-ylterephthalic acid chloride

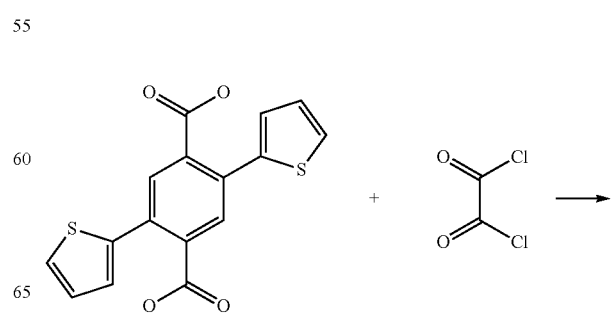

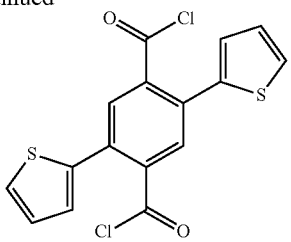

To a solution of 2,5-dithien-2-ylterephthalic acid (4.06 g, 12.29 mmol) and oxalyl chloride (3.12 g, 24.58 mmol) in DCM (100 cm$^3$) is added DMF (1 cm$^3$) at 0° C. After 10 minutes, this mixture is allowed to warm to 23° C. and stirred overnight. The solvent is removed under reduced pressure to give the crude product as a yellow oil (4.38 g, 97%). $^1$H NMR (300 MHz, CDCl$_3$): δ(ppm) 7.90 (s, 2H, Ar—H), 7.51 (dd, J=4.9 and 1.4 Hz, 2H, Ar—H), 7.13-7.20 (m, 4H, Ar—H). This product is used for next step without further purification.

Preparation of 4,9-dihydro-s-indaceno[1,2-b:5,6-b'] dithiophene-4,9-dione

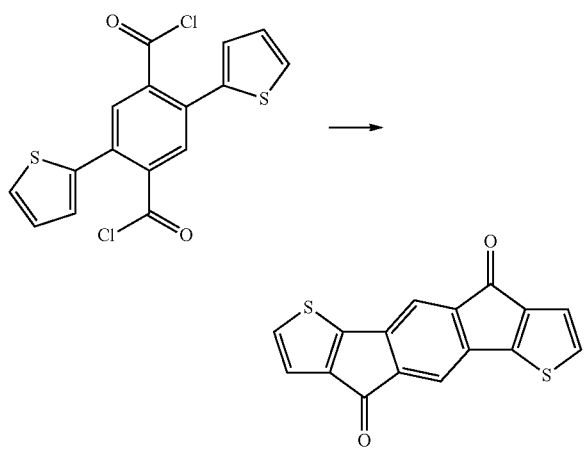

A solution of 2,5-dithien-2-ylterephthalic acid chloride (4.38 g, 11.93 mmol) in DCM (100 cm$^3$) is added to a suspension of anhydrous AlCl$_3$ (5.0 g, 37.5 mmol) in DCM (100 cm$^3$) at 0° C. The resulting mixture is further stirred for 30 minutes, then at 23° C. overnight. The reaction mixture is poured into ice-cold 2M HCl solution. The precipitate is collected and washed with 2M HCl and water then dried in vacuo, to yield the product as a deep blue solid (2.91 g, 83%). MS (m/e): 294 (M$^+$, 100%), 281, 266, 207, 193; IR: ν(cm$^{-1}$) 1704 (C=O).

Preparation of 4,9-dihydro-s-indaceno[1,2-b:5,6-b'] dithiophene

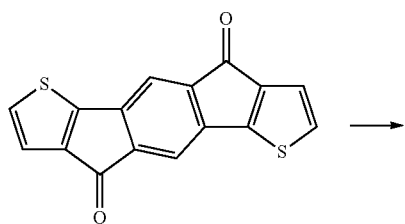

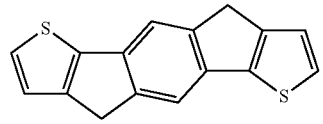

Hydrazine hydrate (11.9 cm$^3$, 245 mmol) is added to a suspension of 4,9-dihydro-s-indaceno[1,2-b:5,6-b'] dithiophene-4,9-dione (9.6 g, 32.6 mmol) and KOH (5.5 g, 97.8 mmol) in diethylene glycol (100 cm$^3$). The mixture is heated to 180° C. for 6 hours, and then allowed to cool to 23° C. overnight. NH$_3$/H$_2$O (1:1, 200 cm$^3$) is added and the mixture is stirred for 30 minutes. The solid is collected by filtration, washed with H$_2$O (2×300 cm$^3$) and IMS (2×300 cm$^3$), and dried under vacuum to yield the product as a brown solid (6.89 g, 79%). $^1$H NMR (300 MHz, d$^6$-DMSO): δ(ppm) 7.71 (s, 2H, Ar—H), 7.55 (d, J=4.9 Hz, 2H), 7.21 (d, J=4.9 Hz, 2H, Ar—H), 3.77 (s, 4H, CH$_2$).

Preparation of 4,9-dihydro-4,4,9,9-tetraoctyl-s-indaceno[1,2-b:5,6-b']dithiophene

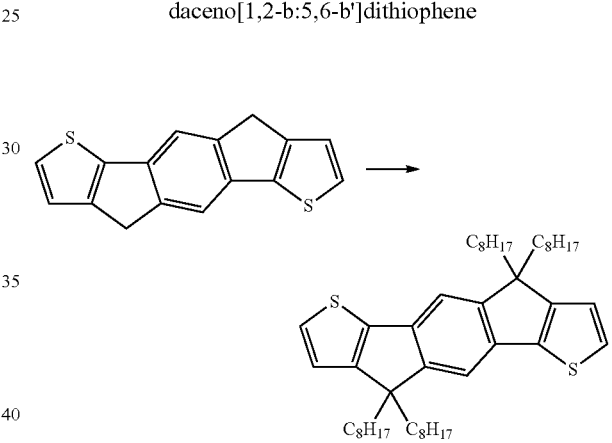

To a 3-necked flask is added 4,9-dihydro-s-indaceno[1,2-b:5,6-b']dithiophene (3.0 g, 11.3 mmol) and anhydrous DMSO (60 cm$^3$) and the mixture is degassed for 20 minutes. To this mixture is added sodium tert-butoxide (6.69 g, 68.9 mmol) portion wise and the mixture is heated to 80° C. 1-Bromooctane (12 cm$^3$, 69.5 mmol) is added dropwise over 30 minutes ensuring the reaction mixture temperature did not rise above 90° C. The mixture is then heated at 85° C. for 3 hours. The mixture allowed to cool to 70° C. and poured into ice-water (100 cm$^3$). The product is extracted with DCM (2×200 cm$^3$) and the combined organics washed with water (3×200 cm$^3$), dried over anhydrous magnesium sulfate, filtered and the solvent removed in vacuo. The crude product is purified by column chromatography (eluent: petroleum ether 40-60) to yield the product as a yellow oil, which crystallised to a yellow solid (2.83 g, 28%). $^1$H NMR (300 MHz, CDCl$_3$): δ(ppm) 7.27 (s, 2H, Ar—H), 7.25 (d, J=4.9 Hz, 2H, Ar—H), 6.96 (d, J=4.9 Hz, 2H, Ar—H), 1.79-2.02 (m, 8H, CH$_2$), 1.02-1.34 (m, 40H, CH$_2$), 0.71-0.93 (m, 20H, CH$_3$ & CH$_2$). $^{13}$C NMR (75 MHz; CDCl$_3$): δ(ppm) 155.1, 153.2, 141.6, 135.6, 126.1, 121.7, 113.1, 53.7, 39.2, 31.8, 30.0, 29.33, 29.25, 24.2, 22.6, 14.1.

Preparation of 2,7-dibromo-4,9-dihydro-4,4,9,9-tetraoctyl-s-indaceno[1,2-b:5,6-b']dithiophene

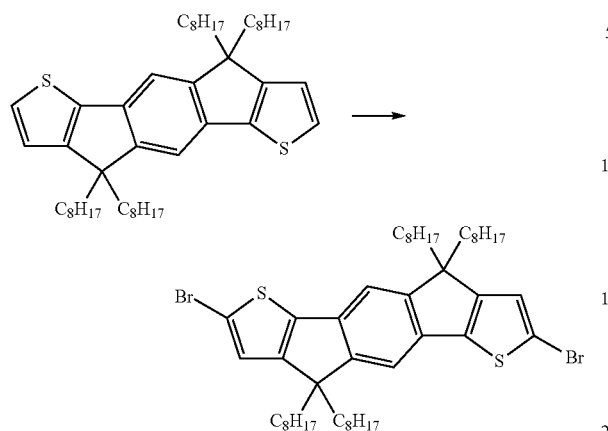

To a solution of 4,9-dihydro-4,4,9,9-tetraoctyl-s-indaceno[1,2-b:5,6-b']-dithiophene (2.0 g, 2.2 mmol) in anhydrous THF (100 cm$^3$) is added NBS (0.98 g, 5.5 mmol) and the solution is heated at 50° C. for 2 hours and then at 40° C. for 17 hours. The mixture is allowed to cool and poured into water (100 cm$^3$). The product is extracted with DCM (2×100 cm$^3$) and the combined organic extracts are dried over anhydrous magnesium sulfate, filtered and the solvent removed in vacuo. The crude product is purified by column chromatography (eluent: petroleum ether 40-60) followed by recrystallisation from DCM/MeOH to yield the product as a salmon coloured crystalline solid (1.81 g, 93%). $^1$H NMR (300 MHz, CDCl$_3$): δ(ppm) 7.17 (s, 2H, Ar—H), 6.96 (s, 2H, Ar—H), 1.75-2.01 (m, 8H, CH$_2$), 1.04-1.35 (m, 40H, CH$_2$), 0.71-0.92 (m, 20H, CH$_3$ & CH$_2$). $^{13}$C NMR (75 MHz, CDCl$_3$): δ(ppm) 154.1, 152.2, 141.9, 135.5, 124.8, 113.0, 112.4, 54.7, 39.0, 31.8, 30.0, 29.3, 24.1, 22.6, 14.1.

Example 2

Preparation of 4,9-dihydro-4,4,9,9-tetrakis(hexadecyl)-s-indaceno[1,2-b:5,6-b']dithiophene

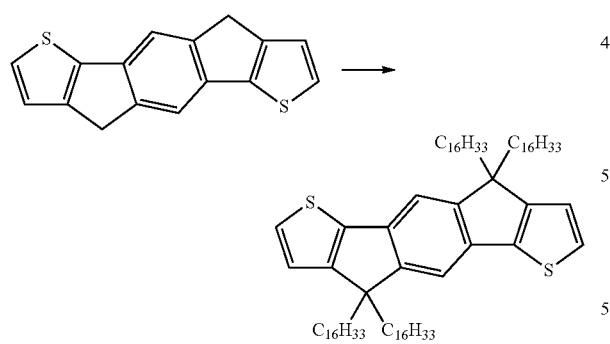

To a 3-neck 250 cm$^3$ flask is added 1 (3.00 g, 11.3 mmol) and anhydrous DMSO (60 cm$^3$) and the mixture is degassed (bubbling N$_2$ into stirred mixture) for 20 minutes. To this is added sodium tert-butoxide (6.69 g, 68.9 mmol) portion wise and the mixture is then heated to 80° C. 1-Bromohexadecane (21.9 cm$^3$, 69.5 mmol) is added dropwise over 30 minutes ensuring the reaction mixture did not rise above 90° C. The mixture is then heated at 85° C. for 3 hours. The mixture is allowed to cool to 70° C. and poured into ice-water (100 cm$^3$). The product is extracted with DCM (2×200 cm$^3$) and the combined organics are washed with water (3×200 cm$^3$), dried over anhydrous magnesium sulfate, filtered and the solvent removed in vacuo. The crude product is purified by column chromatography (eluent: petroleum ether 40-60) followed by recrystallisation from DCM to yield the product as an off-white solid (1.45 g, 11%). $^1$H NMR (300 MHz, CDCl$_3$): δ(ppm) 7.27 (s, 2H, Ar—H), 7.25 (d, J=4.9 Hz, 2H, Ar—H), 6.96 (d, J=4.9 Hz, Ar—H), 1.77-2.06 (m, 8H, CH$_2$), 1.01-1.35 (m, 104H, CH$_2$), 0.76-0.92 (m, 20H, CH$_3$ & CH$_2$). $^{13}$C NMR (75 MHz, CDCl$_3$): δ(ppm) 155.1, 153.2, 141.7, 135.6, 126.1, 121.7, 113.1, 53.7, 39.1, 32.0, 30.0, 29.7, 29.6, 29.4, 24.2, 22.7, 14.1.

Preparation of 2,7-dibromo-4,9-dihydro-4,4,9,9-tetrakis(hexadecyl)-s-indaceno[1,2-b:5,6-b']dithiophene

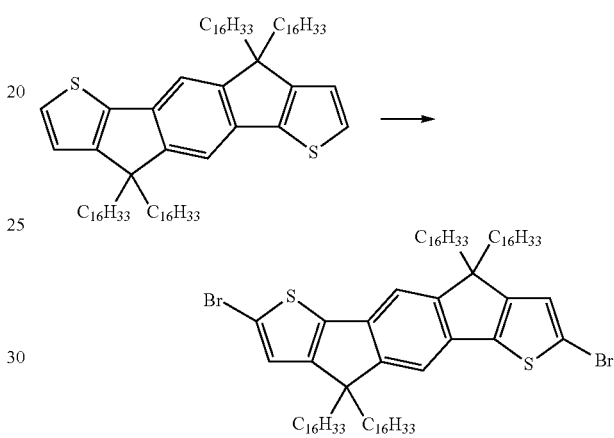

To a solution of 1 (1.00 g, 0.86 mmol) in anhydrous THF (50 cm$^3$) is added NBS (0.32 g, 1.8 mmol) and the solution heated at 50° C. for 2 hours and then at 40° C. for 17 hours. The mixture is allowed to cool and poured into water (50 cm$^3$) and the product is extracted with DCM (2×50 cm$^3$). The combined organic extracts are dried over anhydrous magnesium sulfate, filtered and the solvent removed in vacuo. The crude product is purified by column chromatography (eluent: petroleum ether 40-60 to EtOAc) followed by recrystallisation from DCM/MeOH to yield the product as a pale salmon coloured solid (0.70 g, 62%). $^1$H NMR (300 MHz, CDCl$_3$): δ(ppm) 7.17 (s, 2H, Ar—H), 6.96 (s, 2H, Ar—H), 1.75-2.01 (m, 8H, CH$_2$), 1.03-1.43 (m, 104H, CH$_2$), 0.70-0.97 (m, 20H, CH$_3$ & CH$_2$). $^{13}$C NMR (75 MHz; CDCl$_3$): δ(ppm) 154.1, 152.2, 141.9, 135.5, 124.8, 113.0, 112.4, 54.7, 39.0, 32.0, 29.9, 29.7, 29.6, 29.4, 29.3, 24.1, 22.7, 14.1.

Example 3

Preparation of 2,7-bis(2-thienyl)-4,9-dihydro-4,4,9,9-tetrakis(hexadecyl)-s-indaceno[1,2-b:5,6-b']dithiophene

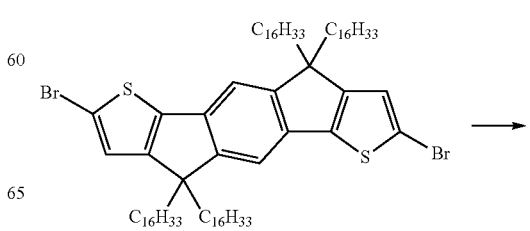

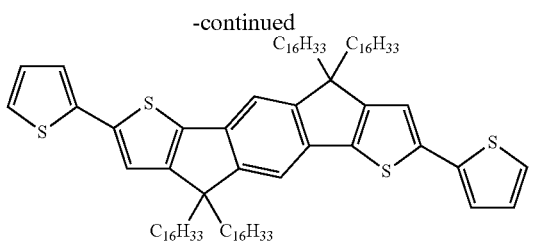

To a degassed mixture of 2,7-dibromo-4,9-dihydro-4,4,9,9-tetrakis(hexadecyl)-s-indaceno[1,2-b:5,6-b']dithiophene (4.81 g, 3.64 mmol) and 2-(tributylstannyl)thiophene (2.68 cm$^3$, 8.0 mmol) in anhydrous DMF (150 cm$^3$) is added bis(triphenylphosphine)palladium(II) dichloride (0.13 g, 0.18 mmol) and the mixture is further degassed. The mixture is heated at 100° C. for 17 hours. The mixture is allowed to cool and poured into water (500 cm$^3$) and the product is extracted with DCM (3×300 cm$^3$). The combined organic extracts are dried over anhydrous magnesium sulfate, filtered and the solvent removed in vacuo. The crude product is purified by column chromatography (eluent: petroleum ether 40-60) to yield the product as a yellow solid (4.09 g, 85%). $^1$H NMR (300 MHz, CDCl$_3$): δ(ppm) 7.22 (s, 2H, Ar—H), 7.18-7.22 (m, 4H, Ar—H), 7.05 (s, 2H, Ar—H), 7.01-7.05 (dd, J=3.6, 5.1 Hz, 2H, Ar—H), 1.79-2.05 (m, 8H, CH$_2$), 1.04-1.34 (m, 104H, CH$_2$), 0.74-0.97 (m, 20H, CH$_2$ & CH$_3$). $^{13}$C NMR (75 MHz; CDCl$_3$): δ(ppm) 155.7, 153.0, 140.6, 138.7, 138.6, 135.6, 127.9, 123.7, 122.8, 118.4, 112.9, 54.1, 39.1, 32.0, 30.0, 29.8, 29.7, 29.6, 29.4, 24.2, 22.7, 14.2.

Preparation of 2,7-bis(5-bromothien-2-yl)-4,9-dihydro-4,4,9,9-tetrakis(hexadecyl)-s-indaceno[1,2-b:5,6-b']dithiophene

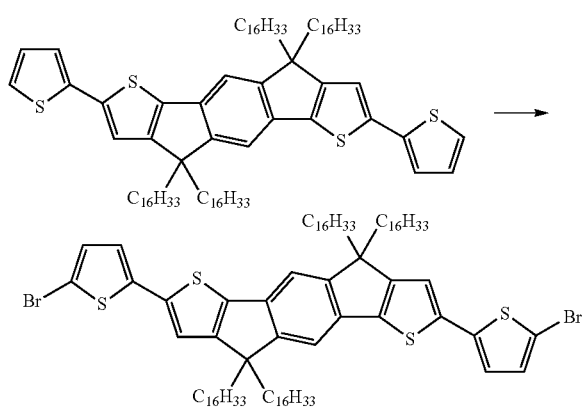

To a solution of 2,7-bis(2-thienyl)-4,9-dihydro-4,4,9,9-tetrakis(hexadecyl)-s-indaceno[1,2-b:5,6-b']dithiophene (2.00 g, 1.5 mmol) in anhydrous THF (100 cm$^3$) is added NBS (0.54 g, 3.0 mmol) and the solution stirred at 23° C. for 17 hours. The mixture is poured into water (300 cm$^3$) and the product is extracted with DCM (2×250 cm$^3$). The combined organic extracts are dried over anhydrous magnesium sulfate, filtered and the solvent removed in vacuo. The crude product is purified by column chromatography (eluent: petroleum ether 40-60) followed by recrystallisation from MeCN/toluene to yield the product as a yellow solid (1.95 g, 87%). $^1$H NMR (300 MHz, CDCl$_3$): δ(ppm) 7.22 (s, 2H, Ar—H), 6.98 (s, 2H, Ar—H), 6.97 (d, J=3.8 Hz, 2H, Ar—H), 6.94 (d, J=3.8 Hz, 2H, Ar—H), 1.78-2.05 (m, 8H, CH$_2$), 1.03-1.36 (m, 104H, CH$_2$), 0.72-0.96 (m, 20H, CH$_2$ & CH$_3$). $^{13}$C NMR (75 MHz; CDCl$_3$): δ(ppm) 155.8, 153.1, 141.0, 140.2, 137.6, 135.6, 130.6, 122.8, 118.5, 113.1, 110.2, 54.2, 39.0, 32.0, 30.0, 29.8, 29.7, 29.6, 29.4, 29.3, 24.1, 22.7, 14.2.

Example 4

Preparation of poly[(2,7-(4,9-dihydro-4,4,9,9-tetrakis(hexadecyl)-s-indaceno[1,2-b:5,6-b']dithiophene))-alt-4,7-(2,1,3-benzothiadiazole)] (1)

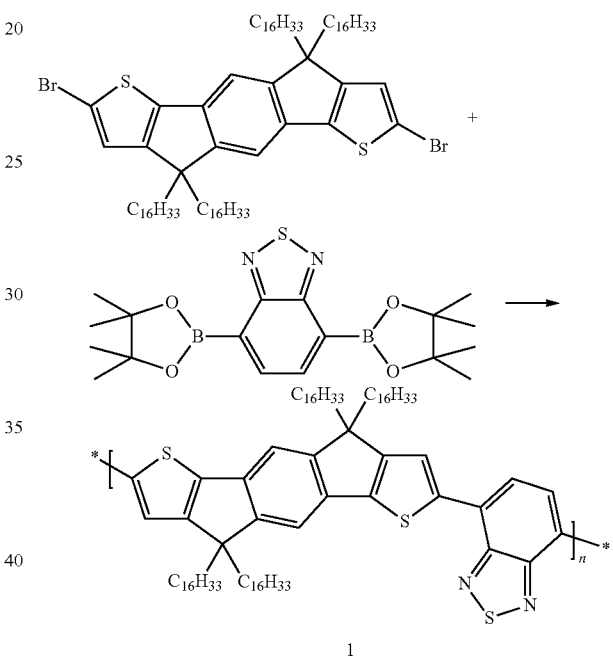

To a mixture of 2,7-dibromo-4,9-dihydro-4,4,9,9-tetrakis(hexadecyl)-s-indaceno[1,2-b:5,6-b']dithiophene (0.60 g, 0.45 mmol), 4,7-bis(4,4,5,5-tetramethyl-1,3,2-dioxaborolan-2-yl)-2,1,3-benzothiadiazole (0.176 g, 0.45 mmol), tris(dibenzylideneacetone)dipalladium(0) (8.3 mg, 0.009 mmol), tri(o-tolyl)phosphine (11 mg, 0.04 mmol) and toluene (15 cm$^3$) is added Aliquat 336 (0.10 g) and the mixture is degassed. To the mixture is added a degassed aqueous solution of sodium carbonate (2.0 M, 0.7 cm$^3$) and the mixture is further degassed. The mixture is heated at 110° C. for 17 hours. The mixture is allowed to cool and poured into methanol (100 cm$^3$). The crude product is collected by filtration and washed with methanol (100 cm$^3$), water (100 cm$^3$) and methanol (100 cm$^3$). The crude product is stirred in water (100 cm$^3$) for 1 hour, filtered and washed with methanol (200 cm$^3$). The solid is taken up in toluene (20 cm$^3$) and precipitated into stirred methanol (60 cm$^3$). The precipitate is collected by filtration to give polymer 1 as a purple solid (0.52 g, 88%). $^1$H NMR as expected. GPC (PhCl, 60° C.) Mw=79,000 g/mol, Mn=31,000 g/mol. λ$_{max}$ (DCM) 656 nm.

Example 5

Preparation of poly[(2,7-bis(2-thienyl)-(4,9-dihydro-4,4,9,9-tetrakis(hexadecyl)-s-indaceno[1,2-b:5,6-b']dithiophene)-alt-4,7-(2,1,3-benzothiadiazole)] (2)

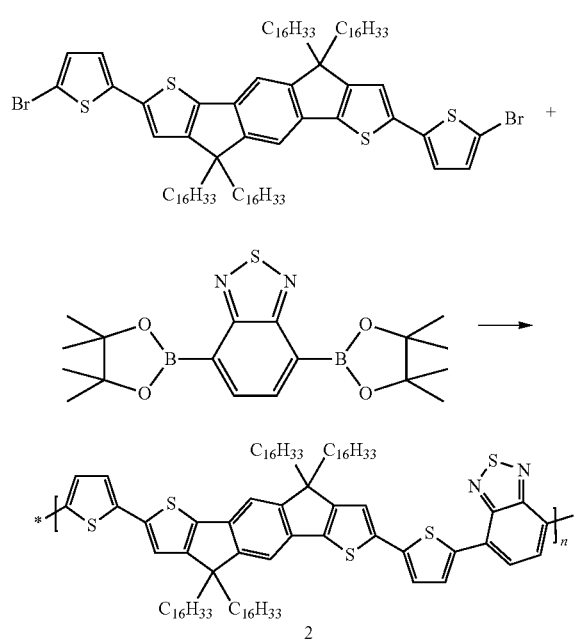

To a mixture of 2,7-bis(5-bromothien2-yl)-4,9-dihydro-4,4,9,9-tetrakis(hexadecyl)-s-indaceno[1,2-b:5,6-b'] dithiophene (1.00 g, 0.67 mmol), 4,7-bis(4,4,5,5-tetramethyl-1,3,2-dioxaborolan-2-yl)-2,1,3-benzothiadiazole (0.26 g, 0.67 mmol), tris(dibenzylideneacetone)dipalladium(0) (12 mg, 0.013 mmol), tri(o-tolyl)phosphine (16 mg, 0.05 mmol) and toluene (25 cm$^3$) is added Aliquat 336 (0.10 g) and the mixture is degassed. To the mixture is added a degassed aqueous solution of sodium carbonate (2.0 M, 1.0 cm$^3$) and the mixture further is degassed. The mixture is heated at 110° C. for 17 hours. The mixture is allowed to cool and poured into methanol (100 cm$^3$). The crude product is collected by filtration and washed with methanol (100 cm$^3$), water (50 cm$^3$) and methanol (50 cm$^3$). The solid is taken up in warm toluene (75 cm$^3$) and precipitated into stirred methanol (250 cm$^3$). The precipitate is collected by filtration, washed with methanol (50 cm$^3$), water (50 cm$^3$) and methanol (50 cm$^3$). The polymer is further purified by soxhlet washing with heptane, acetone and extraction with cyclohexane. The cyclohexane mixture is concentrated in vacuo to 150 cm$^3$ and precipitated into stirred methanol (600 cm$^3$). The polymer is collected by filtration and washed with methanol (100 cm$^3$) to give polymer 2 as a dark red solid (0.86 g, 87%). $^1$H NMR as expected. GPC (PhCl, 60° C.) Mw=101,000 g/mol, Mn=34,000 g/mol. $\lambda_{max}$ (PhCl) 608 nm.

Example 6

Preparation of poly[(2,7-(4,9-dihydro-4,4,9,9-tetrakis(octyl)-s-indaceno[1,2-b:5,6-b']dithiophene)-alt-4,4-(N,N-diphenyl-N-(4-(1-methylpropyl)phenyl)amine)] (3)

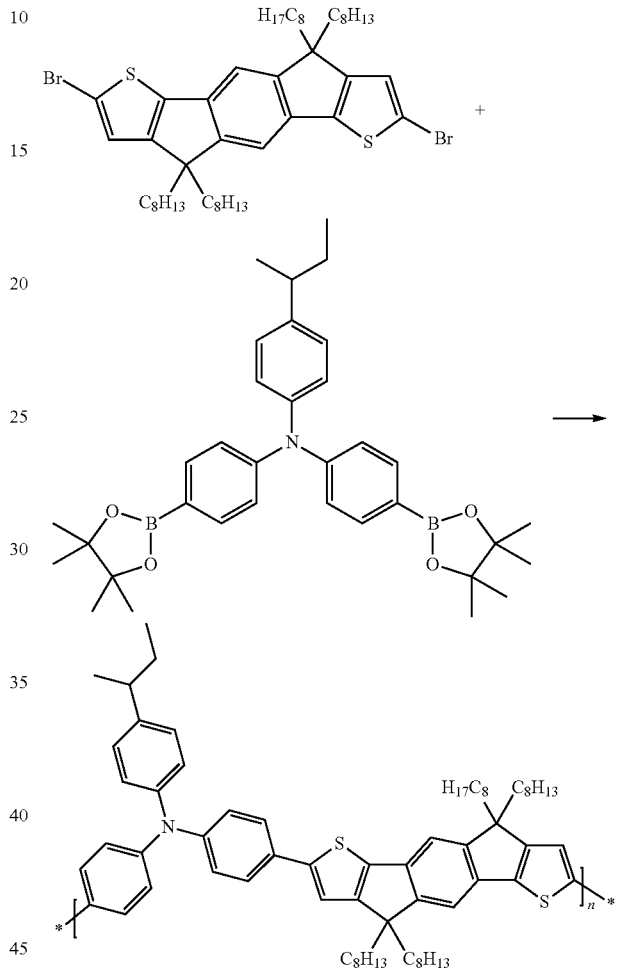

To a mixture of 2,7-dibromo-4,9-dihydro-4,4,9,9-tetraoctyl-s-indaceno[1,2-b:5,6-b']dithiophene (1.250 g, 1.432 mmol), 4,4-bis(4,4,5,5-tetramethyl-1,3,2-dioxaborolan-2-yl)-N,N-diphenyl-N-(4-(1-methylpropyl)phenyl)amine (0.792 g, 1.43 mmol), tolyl boronester (1.7 mg, 0.01 mmol) and potassium phosphate monohydrate (1.45 g, 6.3 mmol) is added degassed toluene (14 cm$^3$), degassed 1,4-dioxane (14 cm$^3$) and degassed water (14 cm$^3$). The mixture is further degassed and lowered into a pre-heated oil bath at 105° C. When the mixture starts to reflux a degassed solution of palladium(II) acetate (2.6 mg, 0.01 mmol) and tri(o-tolyl)phosphine (20.9 mg, 0.07 mmol) in degassed 1,4-dioxane (2 cm$^3$) is added. The mixture is stirred vigorously for 2 hours at 105° C. To the mixture is added tolyl boronester (5.5 mg, 0.03 mmol) and a degassed solution of palladium(II) acetate (2.6 mg, 0.01 mmol) and tri(o-tolyl)phosphine (20.9 mg, 0.07 mmol) in degassed 1,4-dioxane (2 cm$^3$). The mixture is stirred vigorously for 1 hour at 105° C. The mixture cooled to 65° C. and aqueous sodiumdiethyldithiocarbamate trihydrate solution (14 cm$^3$, 10%) and toluene (14 cm$^3$) are added. The mixture is stirred at 65° C. for 17 hours. The mixture is allowed to cool, toluene (20 cm³) is added and the organic layer is washed with water (3×200 cm³). The mixture is precipitated into stirred methanol (150 cm³) and the precipitate is collected by filtration. The crude product is dissolved in toluene (40 cm³) at 30° C. and filtered through a pad of celite with warm toluene (2×80 cm³) washings. The combined solution is precipitated into stirred methanol (500 cm³) and the polymer is collected by filtration, washed with methanol (30 cm³) to give polymer 3 as an orange solid (1.13 g, 78%). ¹H NMR as expected. GPC (PhCl, 60° C.) Mw=65,000 g/mol, Mn=32,000 g/mol. $\lambda_{max}$ (DCM) 476 nm.

Examples 7

Transistor Fabrication and Measurement

Thin-film organic field-effect transistors (OFETs) are fabricated on highly doped silicon substrates with thermally grown silicon oxide (SiO₂) insulating layer, where the substrate serve as a common gate electrode. Transistor source-drain gold electrodes are photolithographically defined on the SiO₂ layer. Prior to organic semiconductor deposition, FET substrates are treated with octyltrichlorosilane (OTS). Thin semiconductor films are then deposited by spin-coating polymer solutions in dichlorobenzene (1 wt %) on FET substrates. The samples are then dried and annealed at 100° C. under nitrogen for 10 mins. The electrical characterization of the transistor devices is carried out in both dry nitrogen and ambient air atmosphere using computer controlled Agilent 4155C Semiconductor Parameter Analyser.

Transistor device characteristics for polymers 1 and 2 of Example 4 and 5, respectively, are measured on thin-films and the devices show typical p-type behaviour with good current modulation, and well-defined linear and saturation regimes. Charge carrier mobilities in the saturation regime ($\mu_{sat}$) for polymers 1 and 2 are calculated and are shown in Table 1. Field-effect mobility was calculated in the saturation regime ($V_d > (V_g - V_0)$) using equation (1):

$$dI_d^{sat}/dW_g = \mu_{sat} * (W * C_i / L) * (V_g - V_0) \quad (1)$$

where W is the channel width, L the channel length, $C_i$ the capacitance of insulating layer, $I_d$ the source-drain current in the saturation regime, $V_d$ the source-drain voltage, $V_g$ the gate voltage, $V_0$ the turn-on voltage, and $\mu_{sat}$ is the charge carrier mobility in the saturation regime. Turn-on voltage ($V_0$) is determined as the onset of source-drain current.

TABLE 1

Transistor device characteristics

| Polymer | Saturated mobility ($\mu_{sat}$) | On/off ratio |
|---|---|---|
| 1 | 0.05 cm²/Vs | 1 × 10⁷ |
| 2 | 0.01 cm²/Vs | 1 × 10⁵ |

The invention claimed is:

1. A conjugated polymer of formula IIa

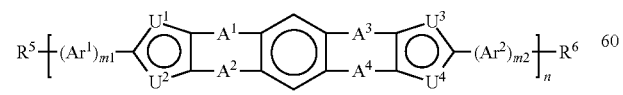

IIa wherein
one of A¹ and A² is a single bond and the other is CR¹R²,
one of A³ and A⁴ is a single bond and the other is CR³R⁴,
one of U¹ and U² is —CH═ or ═CH— and the other is —X—,
one of U³ and U⁴ is —CH═ or ═CH— and the other is —X—,
provided that if A$^i$ is a single bond then the corresponding U$^i$ is X (with i being an index from 1-4),
X is in each occurrence independently selected from —S— and —Se—,
R$^{1-4}$ are independently of each other identical or different groups which are straight-chain or branched-chain, $C_1$-$C_{20}$-alkyl, $C_1$-$C_{20}$-alkoxy, $C_2$-$C_{20}$-alkenyl, $C_2$-$C_{20}$-alkynyl, $C_1$-$C_{20}$-thioalkyl, $C_1$-$C_{20}$-silyl, $C_1$-$C_{20}$-ester, $C_1$-$C_{20}$-amino, or $C_1$-$C_{20}$-fluoroalkyl,
Ar¹ and Ar² are independently of each other
2,1,3-benzoselenadiazole-4,7-diyl,
2,3-dicyano-1,4-phenylene,
2,5-dicyano, 1,4-phenylene,
2,3-difluro-1,4-phenylene,
2,5-difluoro, 1,4-phenylene, or
2,3,5,6-tetrafluoro, 1,4-phenylene, all of which are unsubstituted, mono- or polysubstituted with R¹ as defined above
m1 and m2 are independently of each other 0 or 1, 2, 3 or 4, wherein X in each occurrence is —S—, m1 or m2 is >0,
n is an integer >1, and
R⁵ and R⁶ independently of each other have one of the meanings of R¹ above or denote H halogen, —CH₂Cl, —CHO, —CH═CH₂, —SiR'R"R'", —SnR'R"R'", —BR'R", —B(OR')(OR"), —B(OH)₂, or P-Sp-, wherein P is a polymerizable group and Sp is a spacer group or a single bond, and R', R" and R'" are independently of each other H or an optionally substituted carbyl or hydrocarbyl group optionally comprising one or more hetero atoms, and R' and R" may also form a ring together with the hetero atom to which they are attached.

2. Polymer according to claim 1, characterized in that the monomeric unit

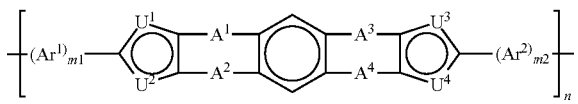

is selected from the group consisting of the following subformulae:

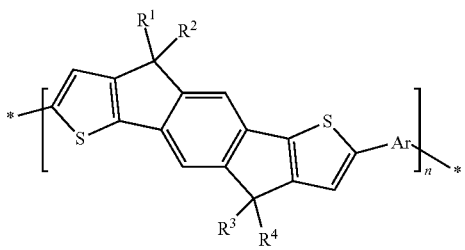

II2

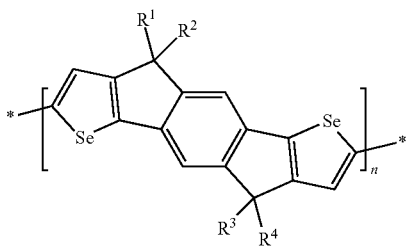

II3

-continued

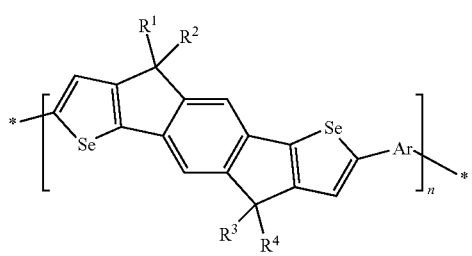
II4

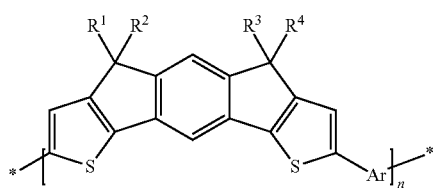
II6

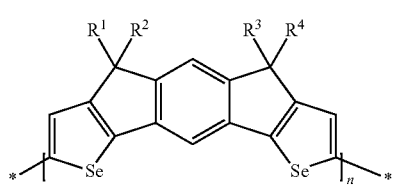
II7

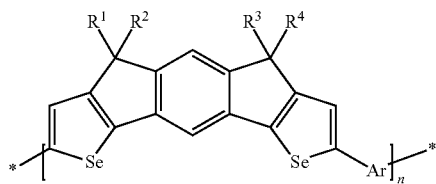
II8

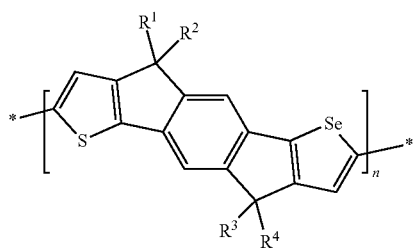
II9

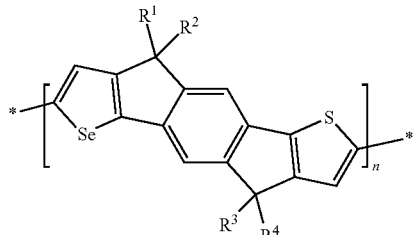
II10

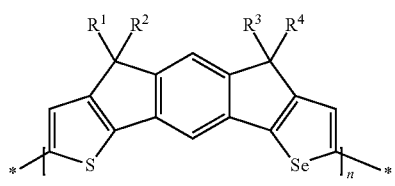
II11

-continued

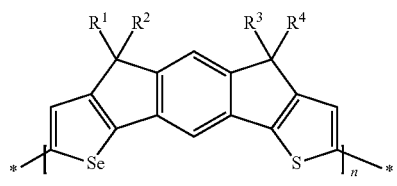
II12

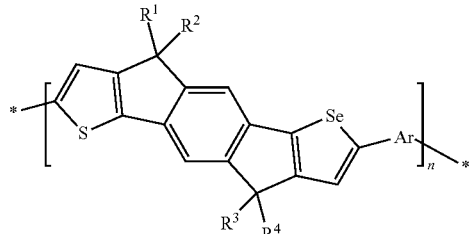
II13

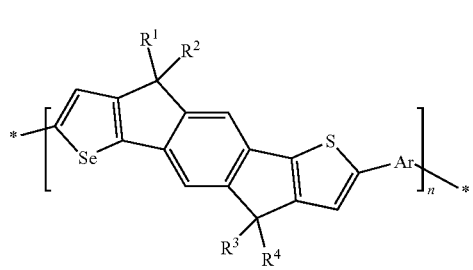
II14

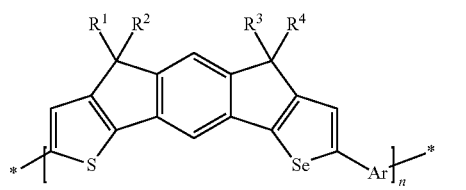
II15

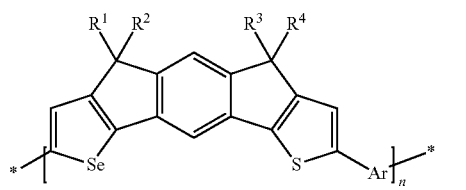
II16 wherein $R^{1-4}$ and n are as defined in claim 1 and Ar has one of the meanings of $Ar^1$ given in claim 1.

3. Polymer according to claim 1, selected of formula IIa1:

$$R^5\text{-chain-}R^6 \qquad \text{IIa1}$$

wherein $R^5$ and $R^6$ are independently of each other identical or different groups which are H, halogen or —P-Sp-, wherein P is a polymerizable group and Sp is a spacer group or a single bond, or $R^5$ and $R^6$ denote —CH$_2$Cl, —CHO, —CH=CH$_2$, —SiR'R"R''', —SnR'R"R''', —BR'R", —B(OR')(OR"), —B(OH)$_2$, wherein R', R" and R''' are, independently of each other, H or an optionally substituted carbyl or hydrocarbyl group optionally comprising one or more hetero atoms, and R' and R" may also form a ring together with the hetero atom to which they are attached and "chain" is a polymer chain selected from the group consisting of subformulae II1-II10 and II2a:

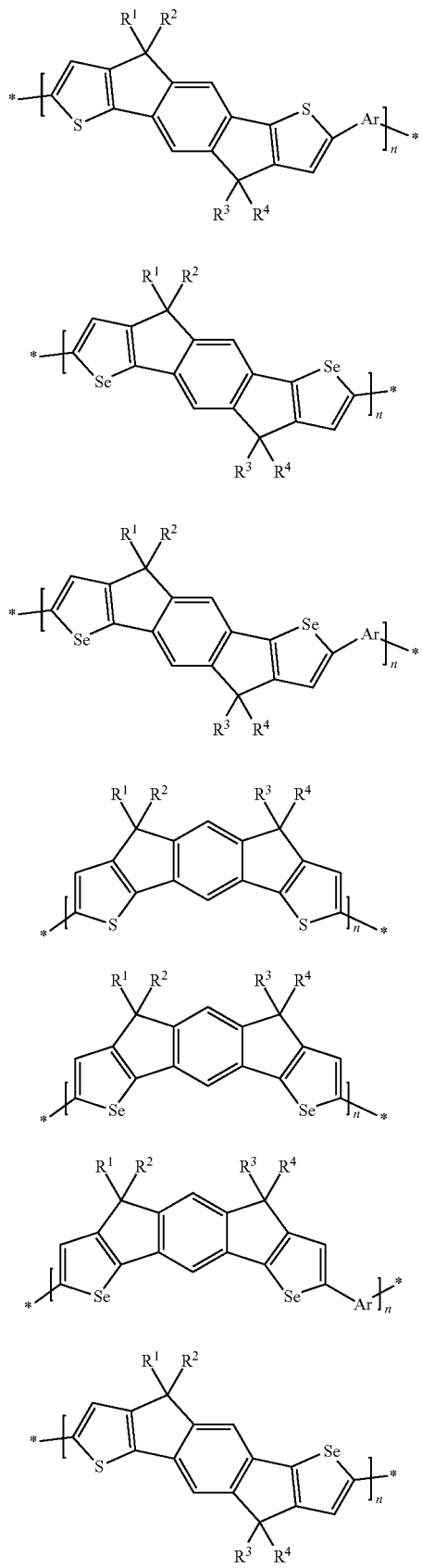

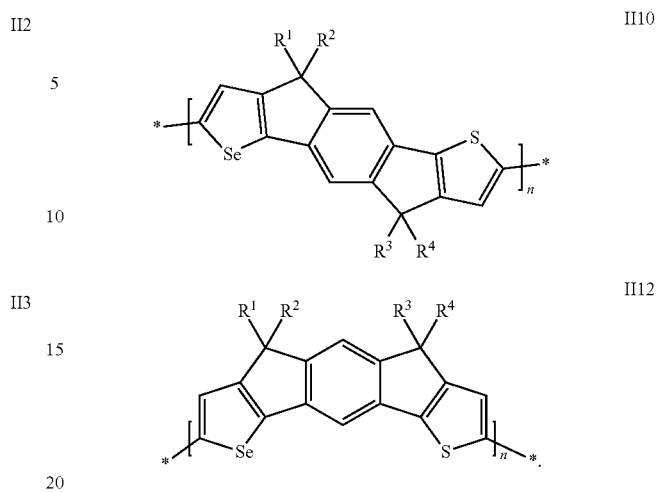

4. Polymer blend comprising one or more polymers according to claim 1 and one or more polymers, preferably selected from polymers having semiconducting, charge transport, hole/electron transport, hole/electron blocking, electrically conducting, photoconducting or light emitting properties.

5. Formulation comprising one or more polymers or polymer blends according to claim 1 and one or more solvents, preferably selected from organic solvents.

6. A method of making a charge transport, semiconducting, electrically conducting, photoconducting or light emitting material in optical, electrooptical, electronic, electroluminescent or photoluminescent component or device comprising employing a polymer of claim 1 therein.

7. Optical, electrooptical or electronic component or device comprising one or more polymers, polymer blends or formulations according to claim 1.

8. Component or device according to claim 7, characterized in that it is selected from the group consisting of organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), solar cells, laser diodes, photoconductors, photodetectors, electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

9. Component or device according to claim 8, which is a bulk heterojunction OPV device.

10. Process of preparing a polymer according to claim 1, by subjecting one or more monomers of formula Ia, and option ally one or more monomers of formula $R^7$—$Ar^1$—$R^8$ and/or $R^7$—$Ar^2$—$R^8$, to an aryl-aryl coupling reaction:

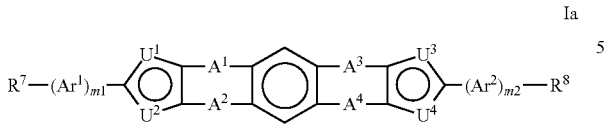

Ia wherein $U^{1-4}$, $A^{1-4}$, $Ar^{1,2}$, m1 and m2 have the meanings given in claim 1, and $R^7$ and $R^8$ are selected from the group consisting of Cl, Br, I, O-tosylate, O-triflate, O-mesylate, O-nonaflate, —$SiMe_2F$, —$SiMeF_2$, —O—$SO_2Z$, —$B(OZ^1)_2$, —$CZ^2$=$C(Z^2)_2$, —C≡CH and —$Sn(Z^3)_3$, wherein Z and $Z^{1-3}$ are selected from the group consisting of alkyl and aryl, each being optionally substituted, and two groups $Z^1$ may also form a cyclic group.

11. Monomer of formula Ia

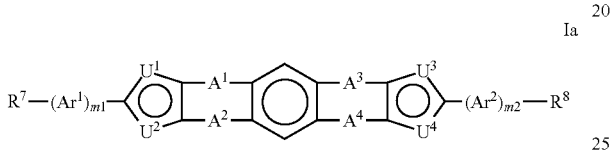

Ia wherein $U^{1-4}$, $A^{1-4}$, $R^{7,8}$, $Ar^{1,2}$, m1 and m2 are as defined in claim 10.

* * * * *